(12) United States Patent
Kitagawa

(10) Patent No.: US 12,727,320 B2
(45) Date of Patent: Sep. 1, 2026

(54) DISPLAY DEVICE, METHOD FOR PRODUCING DISPLAY DEVICE, AND AQUEOUS SOLUTION

(71) Applicant: Sharp Display Technology Corporation, Kameyama City (JP)

(72) Inventor: Makoto Kitagawa, Kameyama City (JP)

(73) Assignee: Sharp Display Technology Corporation, Kameyama City (JP)

( * ) Notice: Subject to any disclaimer, the term of this patent is extended or adjusted under 35 U.S.C. 154(b) by 357 days.

(21) Appl. No.: 18/561,063

(22) PCT Filed: Jun. 24, 2021

(86) PCT No.: PCT/JP2021/023930
§ 371 (c)(1),
(2) Date: Nov. 15, 2023

(87) PCT Pub. No.: WO2022/269851
PCT Pub. Date: Dec. 29, 2022

(65) Prior Publication Data

US 2024/0260302 A1 Aug. 1, 2024

(51) Int. Cl.

| | |
|---|---|
| ***H10K 50/17*** | (2023.01) |
| ***H10K 50/13*** | (2023.01) |
| ***H10K 50/81*** | (2023.01) |
| ***H10K 85/10*** | (2023.01) |

(52) U.S. Cl.
CPC ............. *H10K 50/17* (2023.02); *H10K 50/13* (2023.02); *H10K 50/81* (2023.02); *H10K 85/1135* (2023.02)

(58) Field of Classification Search
CPC ........ H10K 50/17; H10K 50/13; H10K 50/81; H10K 85/1135; H10K 50/15; H10K 59/35; H05B 33/10; H05B 33/14
See application file for complete search history.

(56) References Cited

U.S. PATENT DOCUMENTS

| | | | | |
|---|---|---|---|---|
| 2009/0001876 | A1* | 1/2009 | Okuda | H10K 85/40 313/504 |
| 2010/0006845 | A1* | 1/2010 | Seo | H10D 86/0214 257/E33.003 |
| 2018/0040842 | A1* | 2/2018 | Wu | H01L 21/02008 |
| 2019/0221623 | A1* | 7/2019 | Kamiyama | H10K 59/35 |
| 2021/0083017 | A1* | 3/2021 | Komatsu | H10K 50/165 |
| 2021/0111364 | A1* | 4/2021 | Sakamoto | H10K 50/171 |
| 2021/0143330 | A1* | 5/2021 | Takata | C09D 11/36 |
| 2021/0167312 | A1* | 6/2021 | Akiyama | H10K 50/11 |

(Continued)

FOREIGN PATENT DOCUMENTS

| | | |
|---|---|---|
| JP | 2006-286237 A | 10/2006 |
| JP | 2006-286244 A | 10/2006 |

(Continued)

OTHER PUBLICATIONS

Machine Translation of JP2007-214517, 2007 (Year: 2007).*

*Primary Examiner* — Douglas W Owens
(74) *Attorney, Agent, or Firm* — ScienBiziP, P.C.

(57) ABSTRACT

A hole injection layer included in a display device according to the disclosure contains a mixture (PEDOT/PSS) obtained by mixing polystyrene sulfonic acid (PSS) with polyethylenedioxythiophene (PEDOT), and a polymer adjacent to the PEDOT/PSS.

15 Claims, 32 Drawing Sheets

(56) References Cited

U.S. PATENT DOCUMENTS

| | | | | |
|---|---|---|---|---|
| 2021/0167315 | A1* | 6/2021 | Mishima | G09G 3/3208 |
| 2021/0202877 | A1* | 7/2021 | Mishima | H10K 59/80524 |
| 2023/0369545 | A1* | 11/2023 | Ohshima | H10H 20/8512 |
| 2024/0049585 | A1* | 2/2024 | Sakuma | H10K 71/60 |
| 2024/0074269 | A1* | 2/2024 | Kitagawa | H05B 33/14 |
| 2024/0215431 | A1* | 6/2024 | Utsumi | H10K 50/81 |
| 2024/0381686 | A1* | 11/2024 | Qu | H05B 33/12 |

FOREIGN PATENT DOCUMENTS

| | | | | |
|---|---|---|---|---|
| JP | 2007-095528 | A | | 4/2007 |
| JP | 2007214517 | A | * | 8/2007 |
| JP | 2009-238593 | A | | 10/2009 |

* cited by examiner

DISPLAY DEVICE, METHOD FOR PRODUCING DISPLAY DEVICE, AND AQUEOUS SOLUTION

TECHNICAL FIELD

The disclosure relates to a display device, a method for manufacturing the display device, and an aqueous solution.

BACKGROUND ART

Light-emitting diodes (LEDs) are widely used. For this reason, as disclosed in PTL 1, attention has been paid to improving a charge transport layer and a charge injection layer.

PTL 1 discloses a configuration in which a hole transport layer is patterned by a letterpress printing method for the purpose of eliminating a decrease in luminous efficiency due to a leakage current.

CITATION LIST

Patent Literature

PTL 1: JP 2006-286244 A

SUMMARY

Technical Problem

The inventors of the disclosure have found that an alkaline developing solution deteriorates PEDOT/PSS contained in a hole injection layer in a process of patterning a light-emitting layer of a display device. Here, the PEDOT/PSS is a mixture of polyethylenedioxythiophene (PEDOT) and polystyrene sulfonic acid (PSS).

Due to this deterioration, hole injection efficiency of the hole injection layer decreases, and thus there is a problem in that luminous efficiency of the display device decreases.

Solution to Problem

In order to solve the above-described problems, a display device according to a first aspect of the disclosure includes an anode; a hole injection layer; a first light-emitting layer that emits light of a first color; and a cathode, and the hole injection layer contains a mixture (PEDOT/PSS) in which polystyrene sulfonic acid (PSS) is mixed with polyethylenedioxythiophene (PEDOT), and a first polymer adjacent to the PEDOT/PSS.

In the display device according to a second aspect of the disclosure, the first polymer may be a crosslinked polymer obtained by crosslinking a second polymer, and the second polymer may be a water-soluble polymer.

In the display device according to a third aspect of the disclosure, the first polymer may exhibit alkali resistance.

In the display device according to a fourth aspect of the disclosure, the first polymer may be insoluble in an alkaline solution of pH11 or higher.

In the display device according to a fifth aspect of the disclosure, the first polymer may contain at least one polymer selected from the group consisting of polyvinyl alcohol (PVA), polyvinyl pyrrolidone (PVP), gelatin, nylon, acrylic, urethane, polyester, polyether, melamine, epoxy, polyethyleneimine, and polyethylene oxide.

The display device according to a sixth aspect of the disclosure may further include a second light-emitting layer that emits light of a second color different from the first color.

In the display device according to a seventh aspect of the disclosure, the hole injection layer may be a single layer.

In the display device according to an eighth aspect of the disclosure, the anode may include a first pixel electrode and a second pixel electrode, the hole injection layer may include a first portion overlapping the first pixel electrode and a second portion overlapping the second pixel electrode, and the first portion may be separated from the second portion.

In the display device according to a ninth aspect of the disclosure, the hole injection layer may include a lower layer containing the PEDOT/PSS, and an upper layer containing the first polymer and covering the lower layer.

In order to solve the above-described problems, a method for manufacturing a display device, according to a tenth aspect of the disclosure, includes forming an anode; forming a hole injection layer; forming a first light-emitting layer that emits light of a first color; and forming a cathode, and the forming of the hole injection layer includes curing a water-soluble photoresist adjacent to a mixture (PEDOT/PSS) in which polystyrene sulfonic acid (PSS) is mixed with polyethylenedioxythiophene (PEDOT).

In the method for manufacturing a display device, according to an eleventh aspect of the disclosure, the forming of the hole injection layer may include preparing an aqueous solution containing the PEDOT/PSS and the water-soluble photoresist.

In the method for manufacturing a display device, according to a twelfth aspect of the disclosure, the forming of the hole injection layer may include applying the aqueous solution onto the anode to form a hole injection material layer, partially exposing the hole injection material layer, and developing the hole injection material layer using water.

In the method for manufacturing a display device, according to a thirteenth aspect of the disclosure, the forming of the hole injection layer may include preparing a first aqueous solution containing the PEDOT/PSS, applying the first aqueous solution onto the anode to form a lower layer, preparing a second aqueous solution containing the water-soluble photoresist, and applying the second aqueous solution onto the lower layer to form an upper material layer.

In the method for manufacturing a display device, according to a fourteenth aspect of the disclosure, the forming of the first light-emitting layer may include forming a first resist layer including a positive resist or a negative resist, partially exposing the first resist layer, and developing the first resist layer using an alkaline solution.

The method for manufacturing a display device, according to a fifteenth aspect of the disclosure, may further include forming a second light-emitting layer that emits light of a second color different from the first color, and the forming of the second light-emitting layer may include forming a second resist layer including a positive resist or a negative resist, partially exposing the second resist layer, and developing the second resist layer using an alkaline solution.

In the method for manufacturing a display device, according to a sixteenth aspect of the disclosure, the water-soluble photoresist may contain a water-soluble polymer, a water-soluble crosslinking agent that crosslinks the water-soluble polymer, and a water-soluble photoinitiator that initiates a crosslinking reaction with the water-soluble crosslinking agent.

In order to solve the above-described problems, an aqueous solution according to a seventeenth aspect of the disclosure contains disclosure a mixture (PEDOT/PSS) in which polystyrene sulfonic acid (PSS) is mixed with polyethylenedioxythiophene (PEDOT); and a water-soluble photoresist.

In the aqueous solution according to an eighteenth aspect of the disclosure, the water-soluble photoresist may contain a water-soluble polymer, a water-soluble crosslinking agent that crosslinks the water-soluble polymer, and a water-soluble photoinitiator that initiates a crosslinking reaction with the water-soluble crosslinking agent.

Advantageous Effects of Disclosure

According to an aspect of the disclosure, it is possible to improve luminous efficiency of a self-light-emitting element in a display device.

DESCRIPTION OF EMBODIMENTS

First Embodiment

Method for Manufacturing Display Device and Configuration of Display Device

In the following description, the "same layer" means a layer formed through the same process (film formation process), the "lower layer" means that a layer formed through a process before that of the layer to be compared, and the "upper layer" means that a layer formed through a process after that of the layer to be compared.

Figure 1:
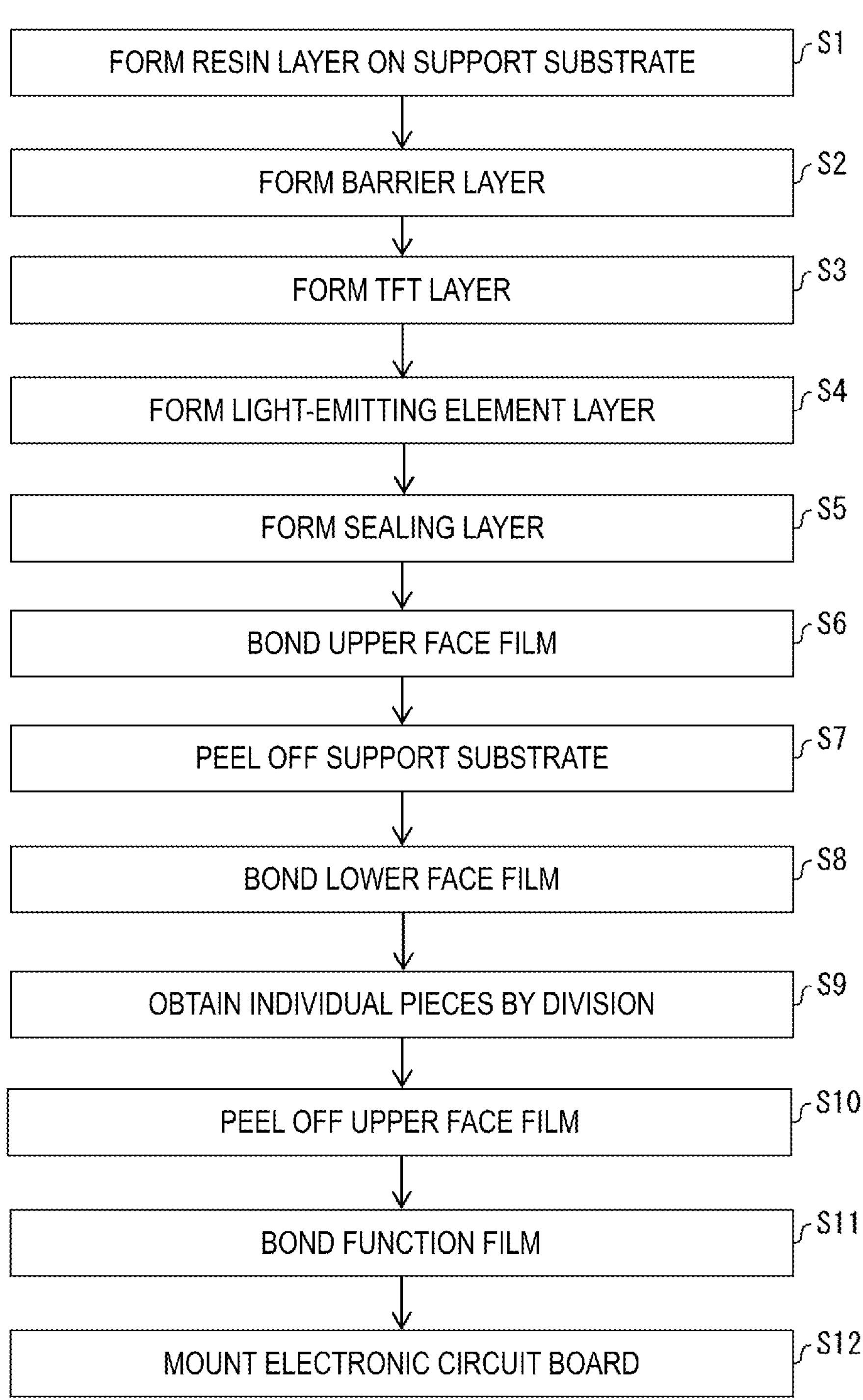
FIG. 1 is a flowchart illustrating a non-limiting example of a method for manufacturing a display device according to the disclosure.
Figure 2:
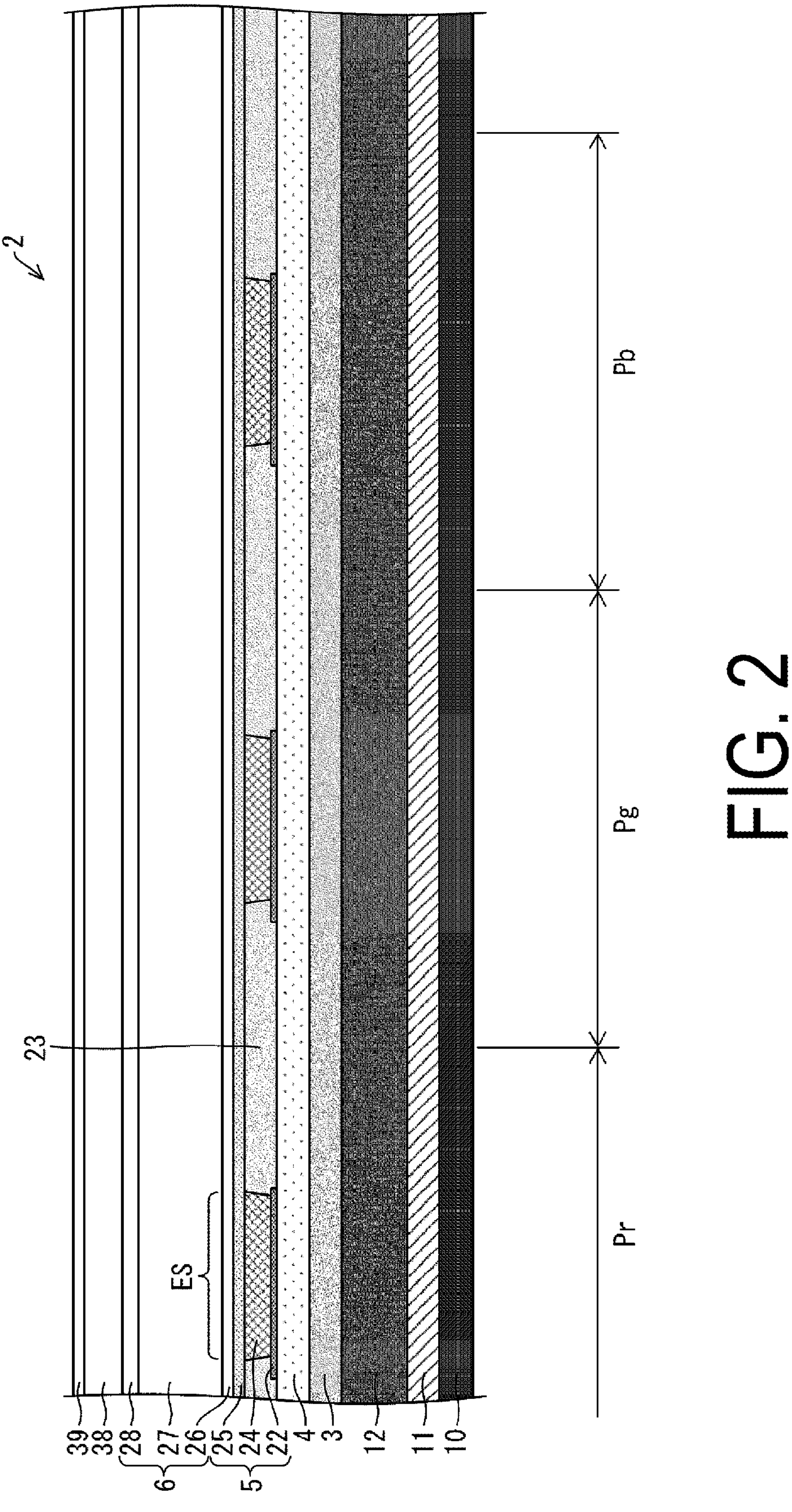
FIG. 2 is a schematic cross-sectional view illustrating a non-limiting example of a configuration of a display region of the display device according to the disclosure.

FIG. 1 is a flowchart illustrating a non-limiting example of a method for manufacturing a display device 2 according to the disclosure. FIG. 2 is a schematic cross-sectional view illustrating a non-limiting example of a configuration of a display region of the display device 2 according to the disclosure.

When the display device 2 that is flexible is manufactured, as illustrated in FIGS. 1 and 2, first, a resin layer 12 is formed on a light-transmissive support substrate (for example, a mother glass) (step S1). Next, a barrier layer 3 is formed (step S2). Next, a thin film transistor layer 4 (TFT layer) is formed (step S3). Next, a light-emitting element layer 5 is formed (step S4). Next, a sealing layer 6 is formed (step S5). Next, an upper face film is bonded onto the sealing layer 6 with an adhesive layer therebetween (step S6).

Next, the support substrate is peeled off from the resin layer 12 through irradiation with a laser beam, or the like (step S7). Next, a lower face film 10 is bonded to the lower face of the resin layer 12 with an adhesive layer 11 therebetween (step S8). Next, a layered body including the lower face film 10, the adhesive layer 11, the resin layer 12, the barrier layer 3, the thin film transistor layer 4, the light-emitting element layer 5, and the sealing layer 6 is divided together with the upper face film to obtain a plurality of individual pieces (step S9). Next, the upper face film is peeled off from each of the obtained individual pieces (step S10), and a function film 39 is bonded onto the sealing layer 6 of each of the obtained individual pieces with an adhesive layer 38 therebetween (step S11). Next, an electronic circuit board (for example, an IC chip and an FPC) is mounted on a portion (terminal portion) of a frame region (non-display region) surrounding a display region where a plurality of subpixels are formed (step S12). Steps S1 to S12 are performed by a display device manufacturing apparatus (including a film formation apparatus that performs steps S1 to S5).

The light-emitting element layer 5 includes a pixel electrode 22 located in a layer higher than the thin film transistor layer 4, an insulating edge cover 23 that covers the edge of the pixel electrode 22, an electroluminescent layer 24 located in a layer higher than the edge cover 23, and a common electrode 25 located in a layer higher than the electroluminescent layer 24.

A light-emitting element ES (electroluminescent element), which is an organic light-emitting diode (OLED) or a quantum dot light-emitting diode (QLED) and includes the island-shaped pixel electrode 22, the electroluminescent layer 24, and the common electrode 25 for each subpixel, is formed in the light-emitting element layer 5, and a subpixel circuit that controls the light-emitting element ES is formed in the thin film transistor layer 4.

The sealing layer 6 is light-transmissive, and includes an inorganic sealing film 26 that covers the common electrode 25, an organic buffer film 27 located in a layer higher than the inorganic sealing film 26, and an inorganic sealing film 28 located in a layer higher than the organic buffer film 27. The sealing layer 6 covering the light-emitting element layer 5 inhibits foreign matters such as water and oxygen from penetrating the light-emitting element layer 5.

The function film 39 may include a polarizing film, a flexible touch panel, a protective film, and the like.

While a flexible display device has been described, in the case of manufacturing a non-flexible display device, formation of a resin layer, replacement of a substrate, and the like are not required generally, and thus, for example, the layering processes of steps S2 to S5 are performed on the glass substrate, and then the processing proceeds to step S9. Furthermore, when the non-flexible display device is manufactured, a light-transmissive sealing member may be bonded using a sealing adhesive under a nitrogen atmosphere instead of or in addition to forming the sealing layer 6. The light-transmissive sealing member can be formed of glass, plastic, or the like.

Configuration of Light-Emitting Element Layer

Figure 3:
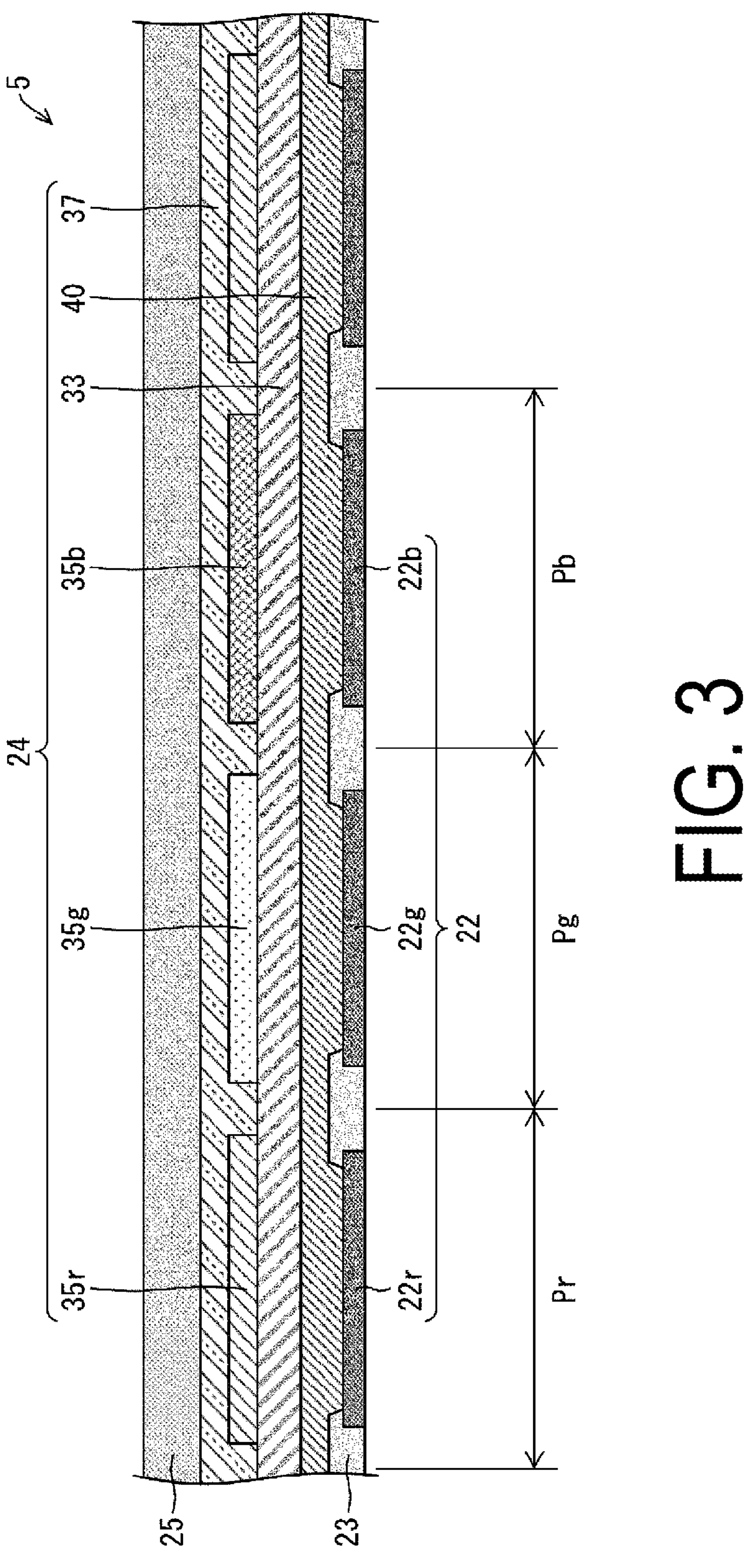
FIG. 3 is a schematic cross-sectional view illustrating a non-limiting example of a configuration in a display region of a light-emitting element layer according to an embodiment of the disclosure.

FIG. 3 is a schematic cross-sectional view illustrating a non-limiting example of a configuration in a display region of the light-emitting element layer 5 according to the present embodiment.

As illustrated in FIG. 3, the light-emitting element layer 5 includes red subpixels Pr that emit red (first color) light, green subpixels Pg that emit green (second color) light, and blue subpixels Pb that emit blue (third color) light.

The pixel electrode 22 includes a red pixel electrode 22*r* (first pixel electrode) provided in the red subpixel Pr, a green pixel electrode 22*g* (second pixel electrode) provided in the green subpixel Pg, and a blue pixel electrode 22*b* (third pixel electrode) provided in the blue subpixel Pb. The pixel electrode 22 is an anode.

In a case where the pixel electrode 22 is a transparent electrode, the pixel electrode 22 may be formed of a transparent conductor such as indium tin oxide (ITO), indium zinc oxide (IZO), or indium gallium zinc oxide. In a case where the pixel electrode 22 is a reflective electrode, the pixel electrode 22 may be formed of, for example, a layered body of silver and a transparent conductor, a layered body of an alloy containing silver and a transparent conductor, or a layered body of aluminum and a transparent conductor.

The common electrode 25 is provided across the red subpixel Pr, the green subpixel Pg, and the blue subpixel Pb. The common electrode 25 is a cathode.

When the common electrode 25 is a transparent electrode, the common electrode 25 may be formed of, for example, a transparent conductor. When the common electrode 25 is a reflective electrode, the common electrode 25 may be formed of, for example, silver, an alloy containing silver, such as MgAg, or aluminum.

The electroluminescent layer 24 includes a hole injection layer 40, a hole transport layer 33, a red light-emitting layer 35*r* (first light-emitting layer), and an electron transport layer 37 in this order from the red pixel electrode 22*r* toward the common electrode 25 in the red subpixel Pr. The electroluminescent layer 24 includes a hole injection layer 40, a hole transport layer 33, a green light-emitting layer 35*g* (second light-emitting layer), and an electron transport layer 37 in this order from the green pixel electrode 22*g* toward the common electrode 25 in the green subpixel Pg. The electroluminescent layer 24 includes a hole injection layer 40, a hole transport layer 33, a blue light-emitting layer 35*b* (third light-emitting layer), and an electron transport layer 37 in this order from the blue pixel electrode 22*b* toward the common electrode 25 in the blue subpixel Pb.

The hole injection layer 40 contains a mixture (PEDOT/PSS) in which polystyrene sulfonic acid (PSS) is mixed with polyethylenedioxythiophene (PEDOT) as a hole transport material. The hole injection layer 40 according to the present embodiment is a single layer. The hole injection layer 40 will be described in detail later.

The hole transport layer 33 contains a hole transport material. Examples of the hole transport material include organic materials such as TFB and poly-TPD, and metal oxides such as MgNiO and LaNiO.

The red light-emitting layer 35*r* contains a red light-emitting material that emits red light. The green light-emitting layer 35*g* contains a green light-emitting material that emits green light. The blue light-emitting layer 35*b* contains a blue light-emitting material that emits blue light. The light-emitting materials may be organic materials or quantum dots.

The electron transport layer 37 contains an electron transport material. Examples of the electron transport material include organic materials such as Bphen, alkali metals, alkaline earth metals, and semiconductor materials such as ZnMgO and ZnO.

Configuration of Hole Injection Layer

Figure 4:
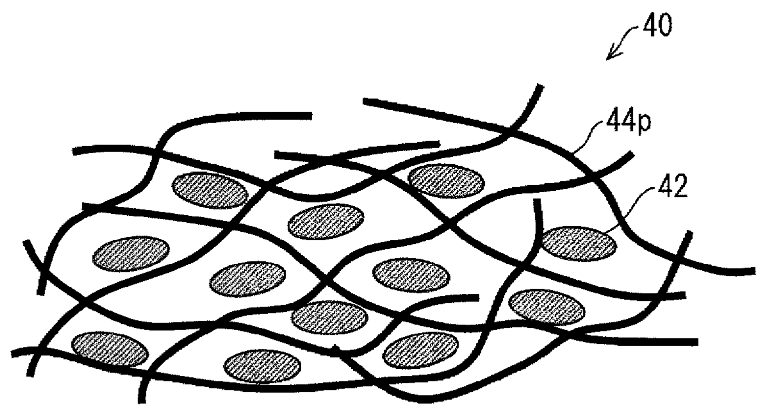
FIG. 4 is a schematic view illustrating a configuration of a hole injection layer illustrated in FIG. 3.

FIG. 4 is a schematic view illustrating a configuration of the hole injection layer 40 illustrated in FIG. 3.

As illustrated in FIG. 4, the hole injection layer 40 contains a PEDOT/PSS 42 and a polymer 44*p* (first polymer) adjacent to the PEDOT/PSS 42. For this reason, in the hole injection layer 40, the PEDOT/PSS 42 is protected by the polymer 44*p*.

The PEDOT/PSS 42 is acidic and vulnerable to an alkaline solution. For this reason, the PEDOT/PSS 42 tends to deteriorate when exposed to an alkaline solution (for example, an alkaline developing solution). Thus, it is preferable that the polymer 44*p* exhibit alkali resistance to further protect the PEDOT/PSS 42. Specifically, it is preferable that the polymer 44*p* be insoluble in an alkaline solution of pH11 or higher. In addition, a crosslinked polymer tends to have higher alkali resistance than a non-crosslinked polymer. Thus, it is preferable that the polymer 44*p* be a crosslinked polymer that is crosslinked to further protect the PEDOT/PSS 42. It is more preferable that the polymer 44*p* be crosslinked into a mesh structure such that the PEDOT/PSS 42 is enclosed in the polymer 44*p*.

Process of Forming Light-Emitting Element Layer

Hereinafter, a process of forming the light-emitting element layer 5 (step S4) illustrated in FIG. 3 in a method for manufacturing the display device 2 will be described in detail with reference to FIGS. 5 to 18.

Figure 5:
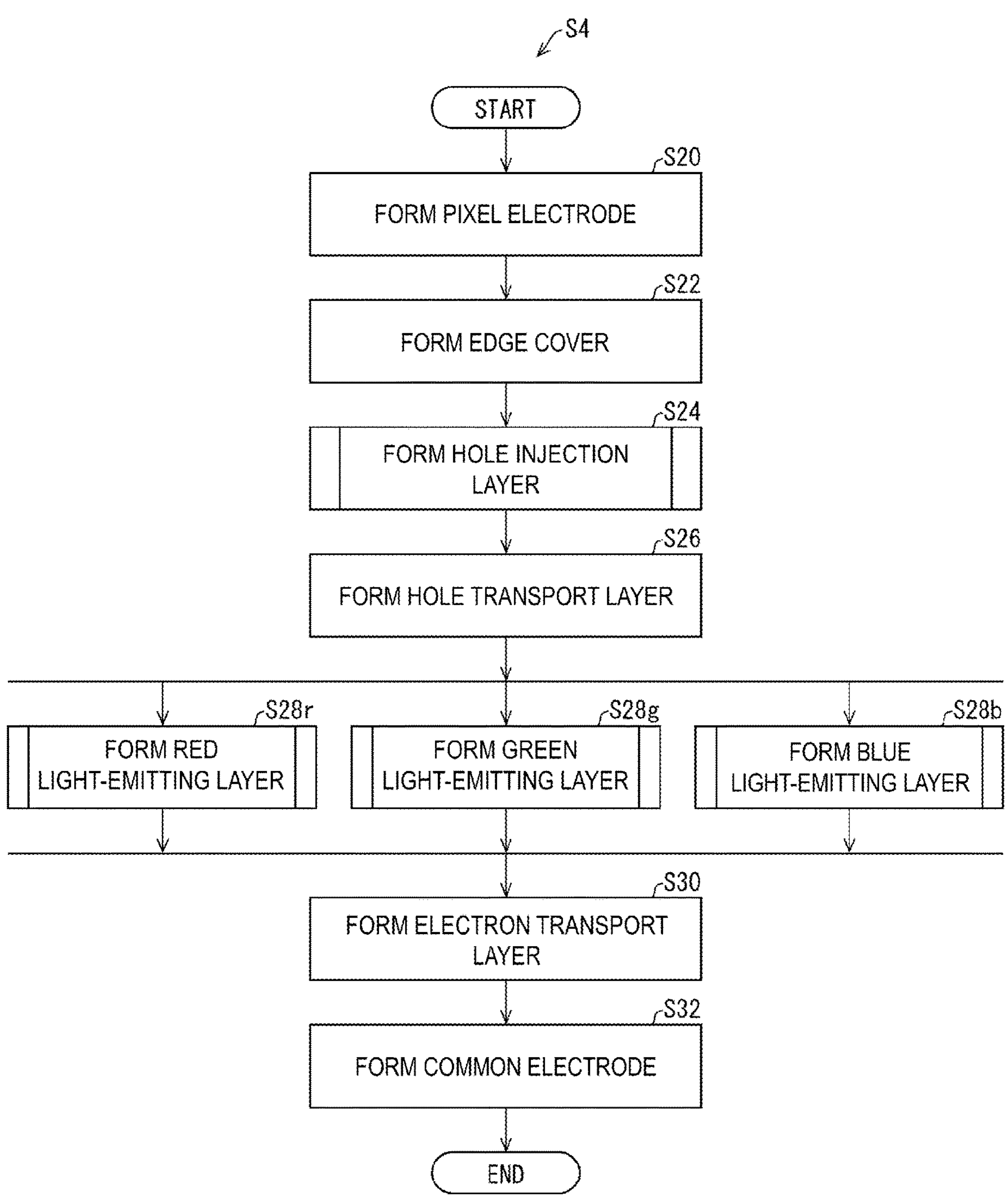
FIG. 5 is a flowchart illustrating an example of a process of forming the light-emitting element layer illustrated in FIG. 3.
Figure 6:
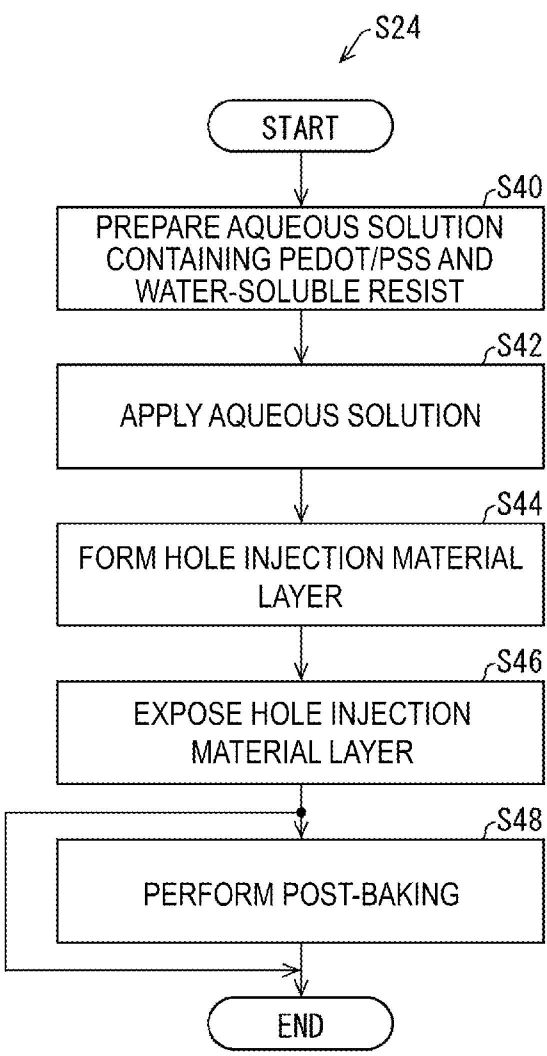
FIG. 6 is a flowchart illustrating an example of a process of forming the hole injection layer illustrated in FIG. 3.
Figure 7:
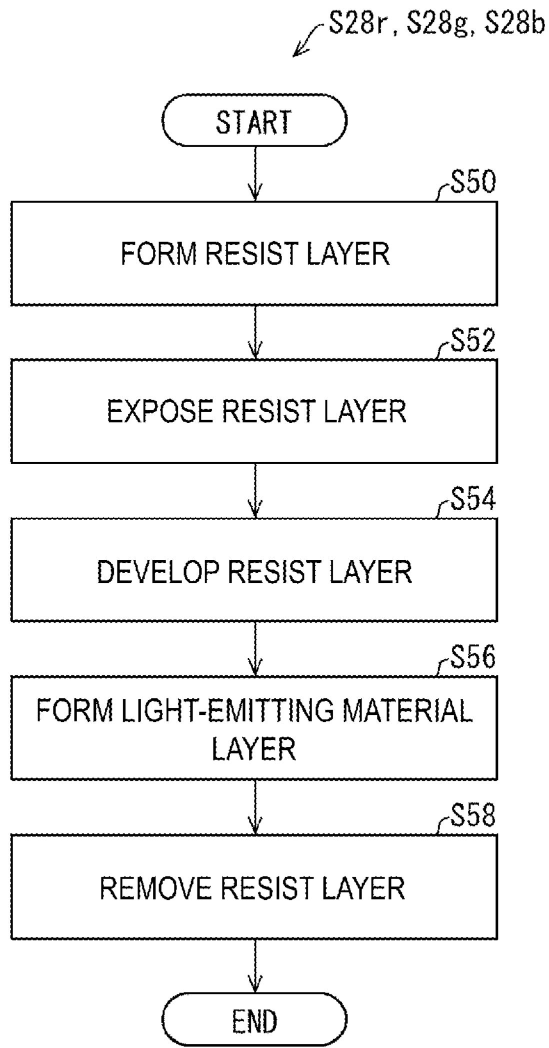
FIG. 7 is a flowchart illustrating an example of a process of forming a light-emitting layer illustrated in FIG. 3.
Figure 8:
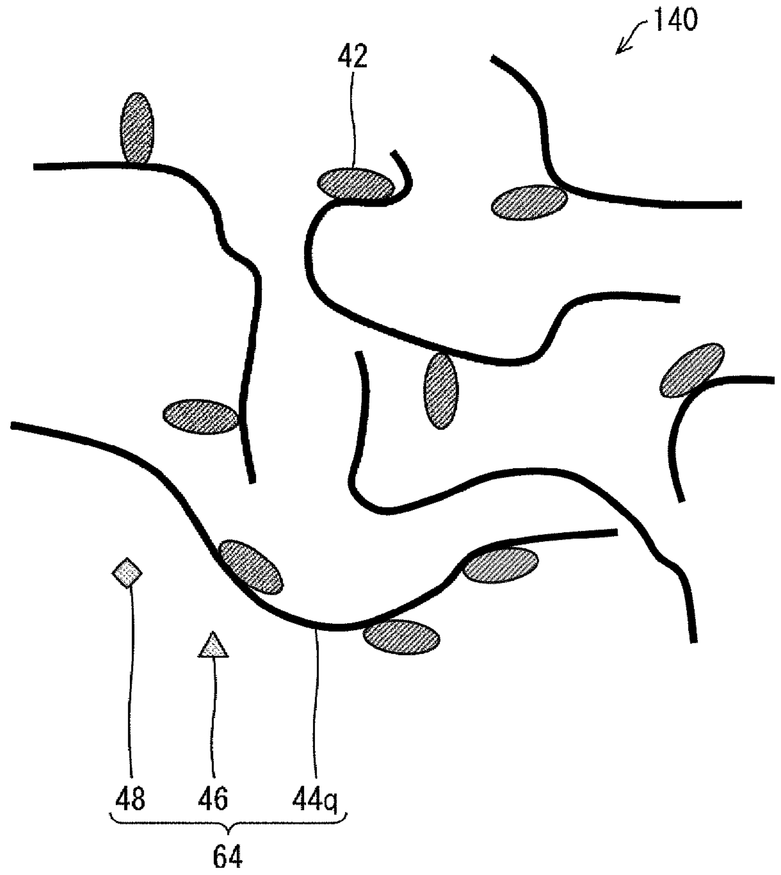
FIG. 8 is a schematic view illustrating an example of an aqueous solution containing PEDOT/PSS and a water-soluble photoresist.

FIG. 5 is a flowchart illustrating an example of a process of forming the light-emitting element layer 5 illustrated in FIG. 3. FIG. 6 is a flowchart illustrating an example of a process of forming the hole injection layer 40 illustrated in FIG. 3. FIG. 7 is a flowchart illustrating an example of a process of forming the red light-emitting layer 35*r*, the green light-emitting layer 35*g*, and the blue light-emitting layer 35*b* illustrated in FIG. 3. FIG. 8 is a schematic view illustrating an example of an aqueous solution 140 containing the PEDOT/PSS 42 and a water-soluble photoresist 64. FIGS. 9 to 16 are schematic cross-sectional views illustrating an example of a process of forming the light-emitting element layer 5 illustrated in FIG. 3.

As illustrated in FIG. 5, an anode is formed on the thin film transistor layer 4 as the pixel electrode 22 (step S20), the edge cover 23 is formed (step S22), and the hole injection layer 40 is formed (step S24).

Step S24 will be described below with reference to FIG. 6 and FIGS. 8 to 10.

As illustrated in FIGS. 6 and 8, first, the aqueous solution 140 containing the PEDOT/PSS 42 and a water-soluble photoresist 64 is prepared (step S40). Since both the PEDOT/PSS 42 and the water-soluble photoresist 64 are water-soluble, it is easy to prepare the aqueous solution 140.

The water-soluble photoresist 64 is of negative type. That is, the unexposed water-soluble photoresist 64 is soluble in water while the exposed water-soluble photoresist 64 is insoluble in water.

As illustrated in FIG. 8, the water-soluble photoresist 64 may contain a water-soluble polymer 44*q* (second polymer), a water-soluble crosslinking agent 46, and a water-soluble photoinitiator 48. The water-soluble polymer 44*q* is an uncrosslinked polymer that is not crosslinked. The water-soluble crosslinking agent 46 crosslinks the water-soluble polymer 44*q*. The water-soluble photoinitiator 48 initiates a crosslinking reaction of the water-soluble polymer 44*q* by the water-soluble crosslinking agent 46 through exposure. For the exposure, any of ultraviolet rays, electron beams, laser beams, and the like may be used.

Thus, the water-soluble polymer 44*q* exhibits water solubility when it is not crosslinked, and constitutes the polymer 44*p* by crosslinking. As described above, it is preferable that the crosslinked polymer 44*p* exhibit alkali resistance. Such a crosslinked polymer 44*p* contains, for example, at least one polymer selected from the group consisting of polyvinyl alcohol (PVA), polyvinyl pyrrolidone (PVP), gelatin, nylon, acrylic, urethane, polyester, polyether, melamine, epoxy, polyethyleneimine, and polyethylene oxide.

As illustrated in FIG. 8, it is presumable that the PEDOT/PSS 42 is attached to the water-soluble polymer 44*q* in the aqueous solution 140. For this reason, it is presumable that the PEDOT/PSS 42 is attached to the polymer 44*p* to be protected by the polymer 44*p* in the hole injection layer 40.

Step S40 may be performed before step S20 and step S22, or may be performed simultaneously in parallel with step S20 and step S22.

Figure 9:
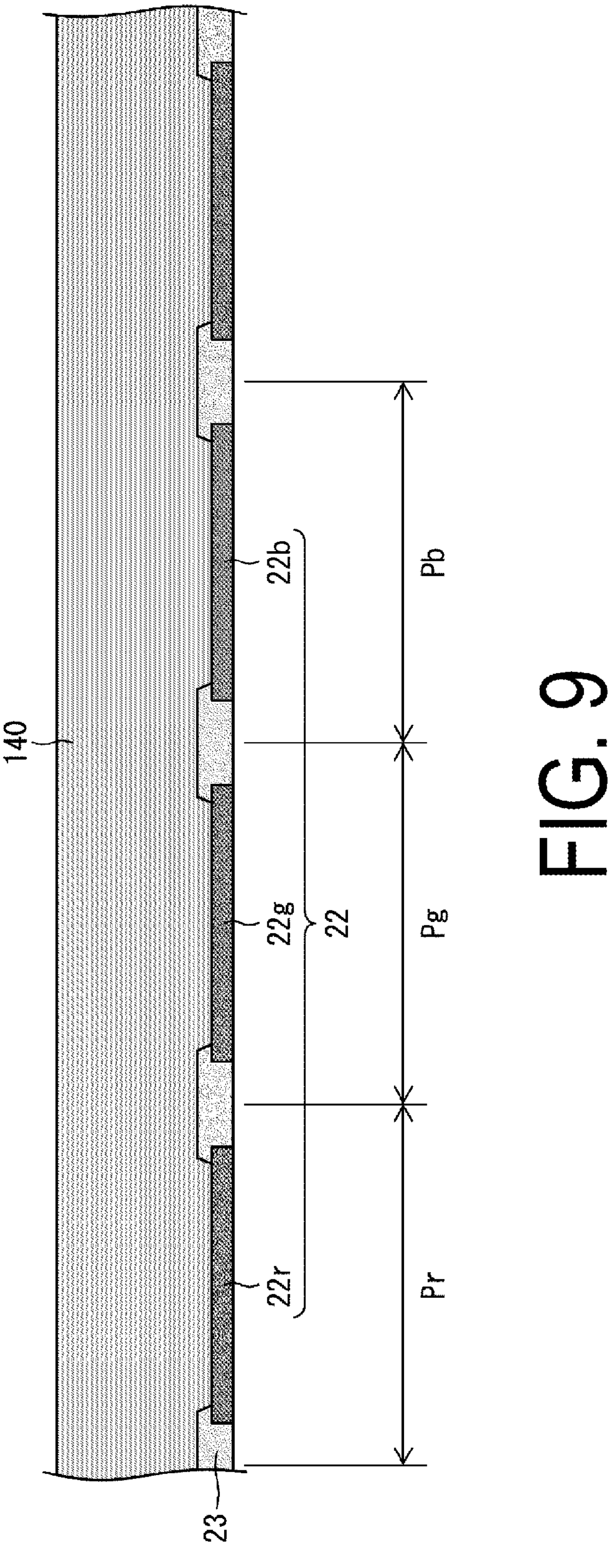
FIG. 9 is a schematic cross-sectional view illustrating an example of the process of forming the light-emitting element layer illustrated in FIG. 3.

Next, as illustrated in FIGS. 6 and 9, the aqueous solution 140 is applied onto the pixel electrode 22 and the edge cover 23 (step S42). An application method may be any method such as a bar coating method, a spin coating method, or an electrostatic spraying method.

Figure 10:
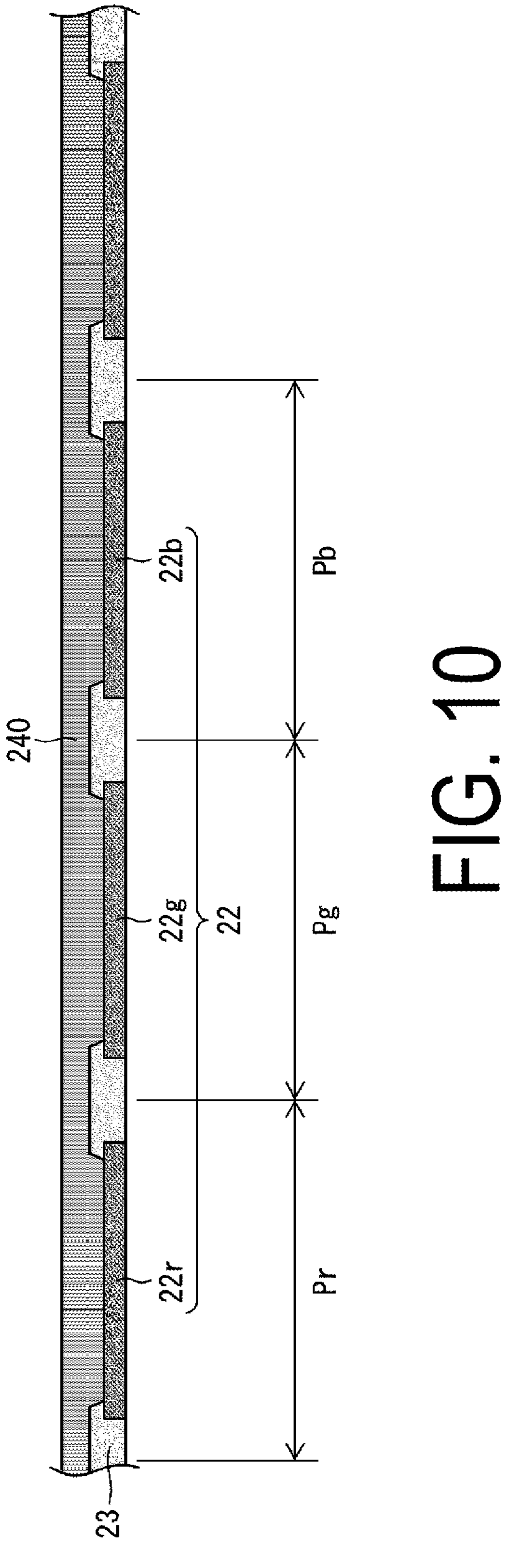
FIG. 10 is a schematic cross-sectional view illustrating an example of the process of forming the light-emitting element layer illustrated in FIG. 3.

Next, as illustrated in FIGS. 6 and 10, the film of the aqueous solution 140 is pre-baked to substantially dry the aqueous solution 140, thereby forming a hole injection material layer 240 from the film of the aqueous solution 140 (step S44). The pre-baking is performed at, for example, approximately 80° C. to 100° C. The hole injection material layer 240 has a thickness of, for example, approximately 20 nm to 100 nm.

Next, as illustrated in FIG. 6, the hole injection material layer 240 is exposed (step S46). By the exposure, the water-soluble photoresist 64 included in the hole injection material layer 240 is cured. By the curing, the hole injection layer 40 is formed from the hole injection material layer 240. Further, in order to complete the curing of the hole injection layer 40, the hole injection layer 40 may be post-baked as necessary (step S48). The post-baking is performed, for example, at approximately 130° C. to 150° C.

As illustrated in FIG. 5, after step S24, the hole transport layer 33 is formed (step S26). The thickness of the hole transport layer 33 is, for example, approximately 20 nm to 50 nm.

Next, as illustrated in FIG. 5, formation of the red light-emitting layer 35*r* (step S28*r*), formation of the green light-emitting layer 35*g* (step S28*g*), and formation of the blue light-emitting layer 35*b* (step S28*b*) are performed in an arbitrary order by using a photolithography technique. For simplification of description, an example in which the processing is performed in the order of red, green, and blue, that is, in the order of step S28*r*, step S28*g*, and step S28*b* will be described below.

Step S28*r* will be described below with reference to FIG. 7 and FIGS. 11 to 14.

Figure 11:
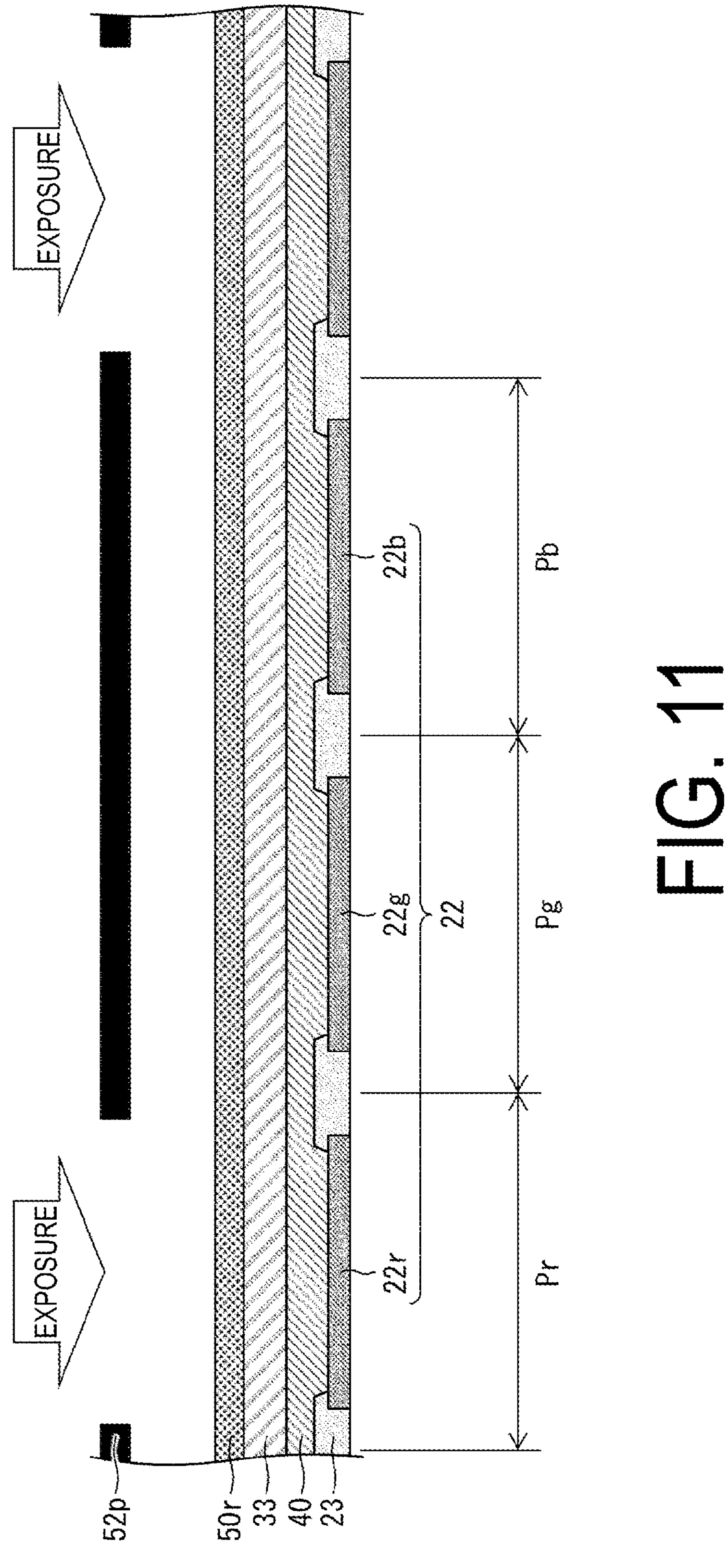
FIG. 11 is a schematic cross-sectional view illustrating an example of the process of forming the light-emitting element layer illustrated in FIG. 3.

As illustrated in FIGS. 7 and 11, a first resist layer 50*r* is formed (step S50), and the first resist layer 50*r* is partially exposed (step S52). The partial exposure in step S52 is so-called “patterning exposure”.

In step S50, the first resist layer 50*r* includes a positive photoresist (hereinafter referred to as a “positive resist”) or a negative photoresist (hereinafter referred to as a "negative resist"). In the positive resist, an unexposed portion is insoluble in a developing solution, and an exposed portion is soluble in a developing solution. On the other hand, in the negative resist, an unexposed portion is soluble in a developing solution, and an exposed portion is soluble in a developing solution. The first resist layer 50*r* is formed across the red subpixel Pr, the green subpixel Pg, and the blue subpixel Pb. Step S50 is performed, for example, by applying a positive resist or a negative resist to the hole transport layer 33 and performing pre-baking thereon at approximately 70° C. to 100° C. FIG. 11 illustrates an example in which the first resist layer 50*r* includes a positive resist.

In step S52, the first resist layer 50*r* is partially exposed such that a portion of the first resist layer 50*r* in the red subpixel Pr is soluble in the developing solution and portions of the first resist layer 50*r* in the green subpixel Pg and the blue subpixel Pb are insoluble in the developing solution. When the first resist layer 50*r* includes a positive resist, the first resist layer 50*r* is exposed using a mask 52*p* in which optical openings are provided at positions corresponding to the red subpixels Pr. On the other hand, when the first resist layer 50*r* includes a negative resist, the first resist layer 50*r* is exposed using a mask 52*n* (see FIG. 18) in which optical openings are provided at positions corresponding to the green subpixel Pg and the blue subpixel Pb.

Figure 12:
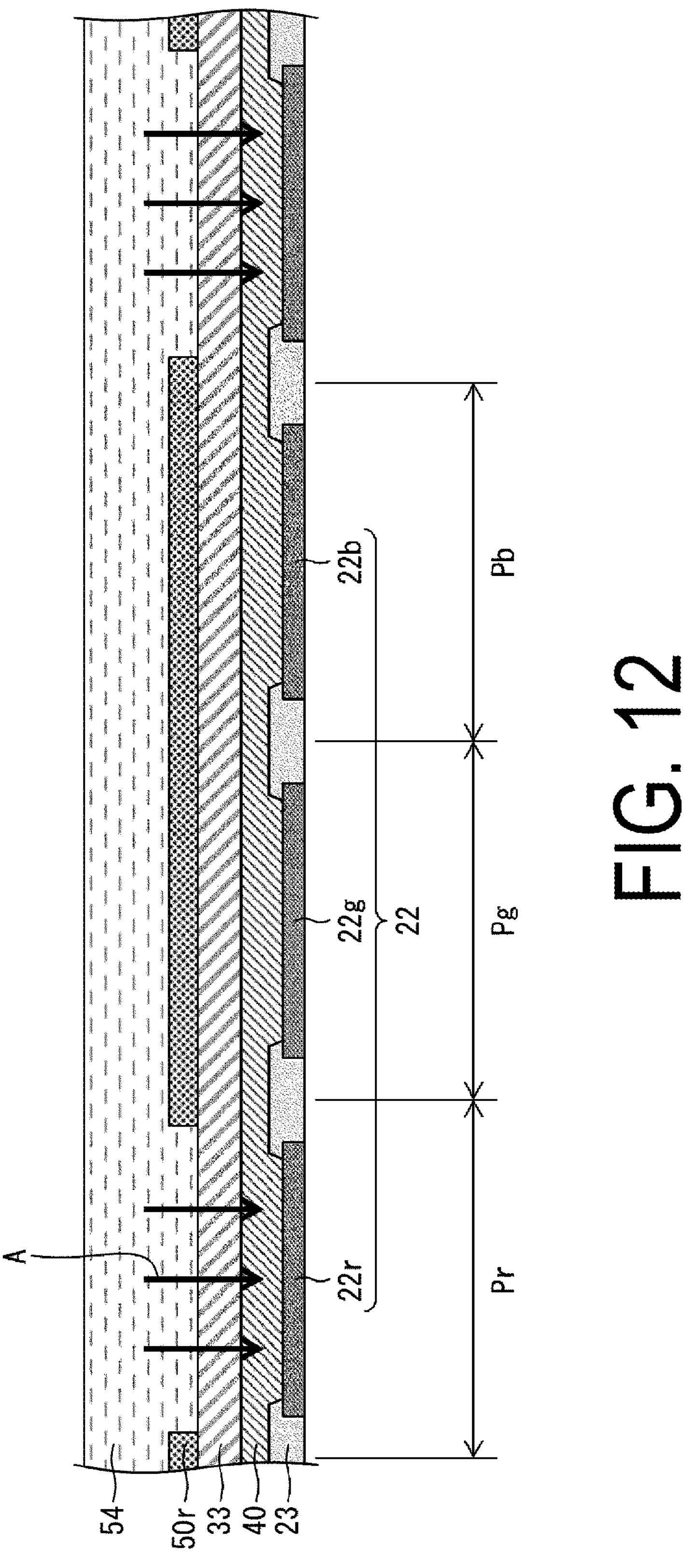
FIG. 12 is a schematic cross-sectional view illustrating an example of the process of forming the light-emitting element layer illustrated in FIG. 3.

Next, as illustrated in FIGS. 7 and 12, the first resist layer 50*r* is developed using a developing solution 54 (step S54). The developing solution 54 is an alkaline solution and contains, for example, a base such as tetramethylammonium hydroxide (TMAH) or potassium hydroxide (KOH). The portion of the first resist layer 50*r* in the red subpixel Pr is dissolved in the developing solution 54 and removed. As a result, as indicated by arrows A in FIG. 12, in the red subpixel Pr, the developing solution 54 reaches the hole transport layer 33 and further reaches the hole injection layer 40 through the hole transport layer 33. Since pinholes are usually formed in the hole transport layer 33, the developing solution 54 can reach the hole injection layer 40 through the pinholes of the hole transport layer 33.

As described above, the PEDOT/PSS 42 tends to deteriorate due to an alkaline solution. For this reason, in a comparative example in which a hole injection layer does not contain a polymer, PEDOT/PSS deteriorates, and hole injection efficiency of the hole injection layer is lowered. In contrast, according to the configuration of the disclosure in which the hole injection layer 40 contains the polymer 44*p*, the PEDOT/PSS 42 is protected by the polymer 44*p*, and thus the PEDOT/PSS 42 is less likely to deteriorate. Thus, in the configuration of the disclosure, the deterioration of the hole injection layer in step S54 is reduced, and thus it is possible to improve luminous efficiency of the red subpixel Pr as compared to the comparative example.

Figure 13:
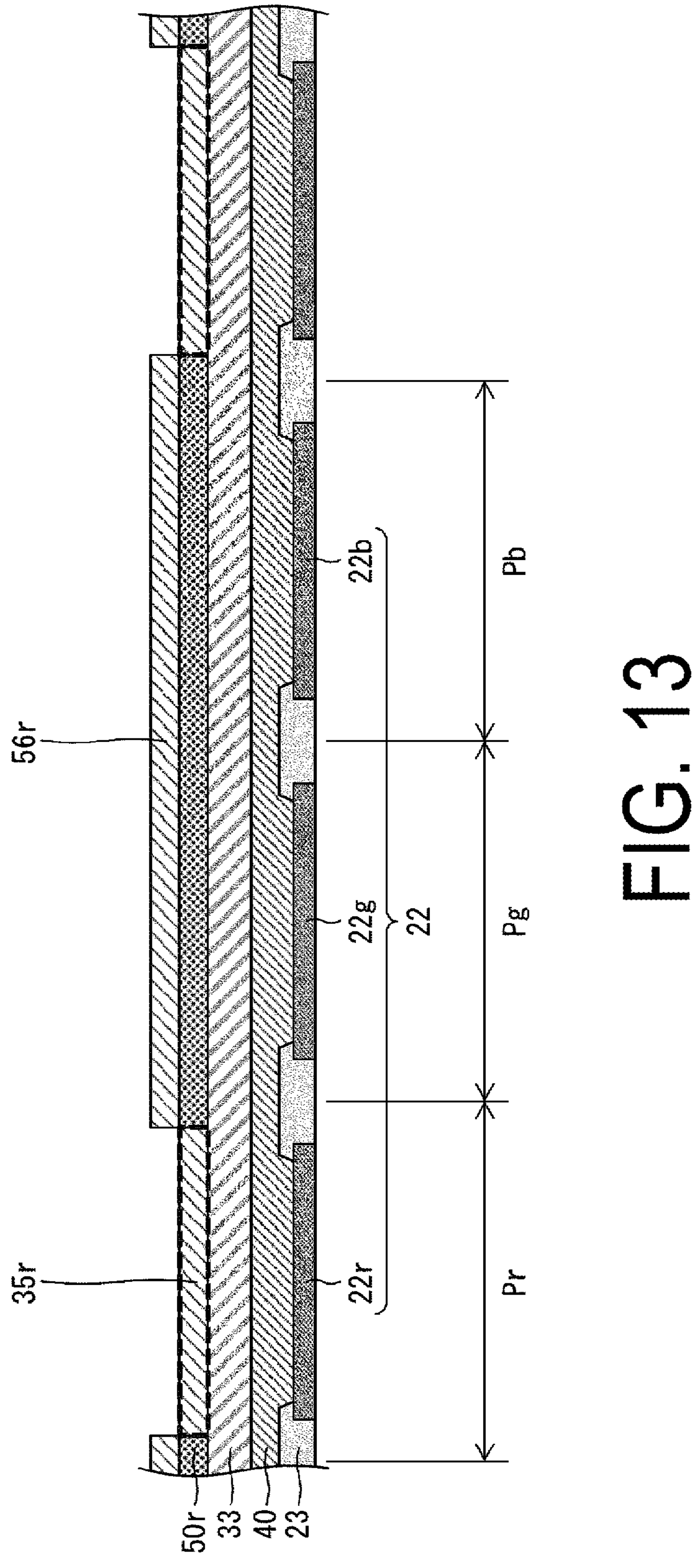
FIG. 13 is a schematic cross-sectional view illustrating an example of the process of forming the light-emitting element layer illustrated in FIG. 3.

Next, as illustrated in FIGS. 7 and 13, a red light-emitting material layer 56*r* is formed (step S56). The red light-emitting material layer 56*r* contains a light-emitting material that emits red light. The red light-emitting material layer 56*r* is formed across the red subpixel Pr, the green subpixel Pg, and the blue subpixel Pb. The red light-emitting material layer 56*r* is formed on the first resist layer 50*r* and the hole transport layer 33 exposed from the first resist layer 50*r*.

Figure 14:
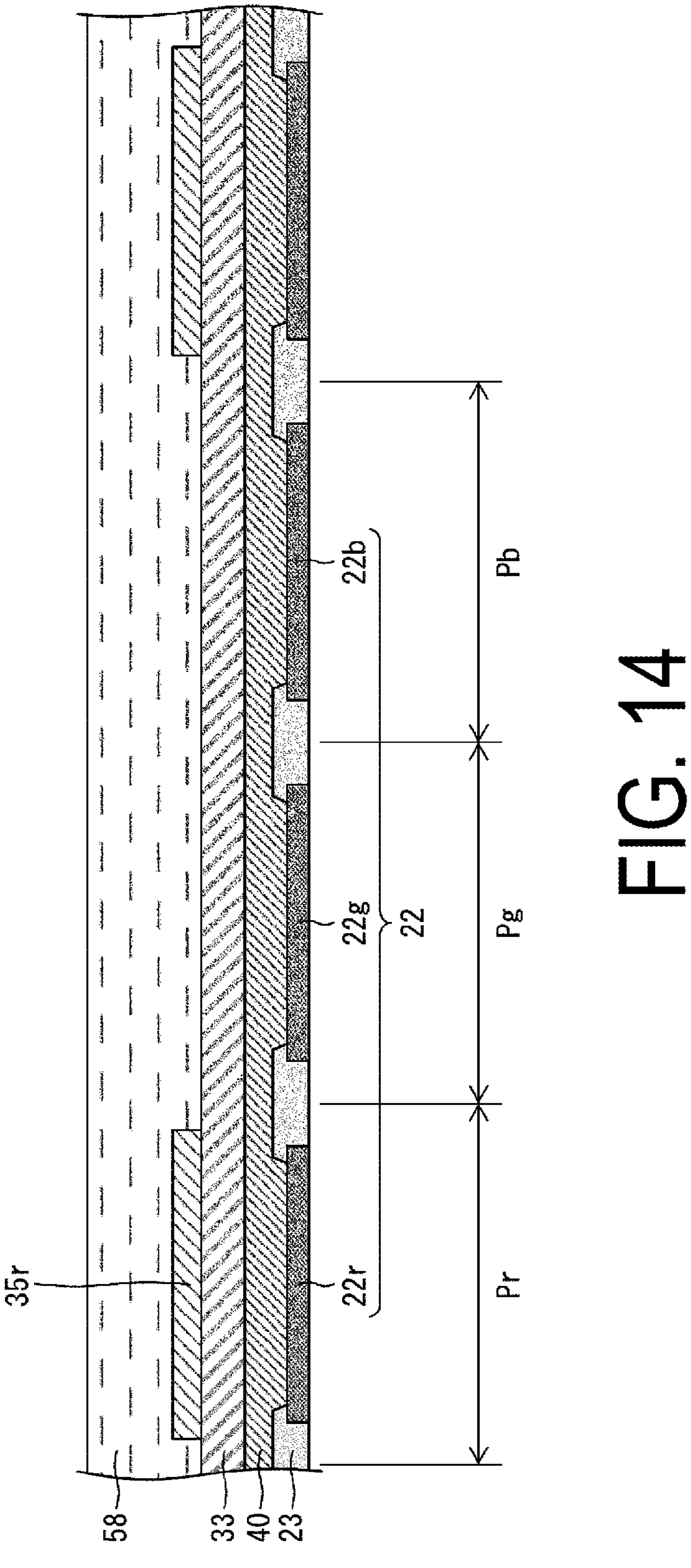
FIG. 14 is a schematic cross-sectional view illustrating an example of the process of forming the light-emitting element layer illustrated in FIG. 3.

Next, as illustrated in FIGS. 7 and 14, the first resist layer 50*r* is removed using a stripping solution 58 (step S58). The stripping solution 58 contains, for example, an organic solvent such as PGMEA, acetone, or PGME. The first resist layer 50*r* is soluble in such organic solvents regardless of whether exposure has been performed. Alternatively, in an example in which the first resist layer 50*r* contains a positive resist, the stripping solution 58 may be the same as the developing solution 54. In this case, the first resist layer 50*r* becomes soluble in the stripping solution 58 by exposing the entire first resist layer 50*r*.

The stripping solution 58 penetrates the red light-emitting material layer 56*r* and dissolves the first resist layer 50*r*. Then, a portion of the red light-emitting material layer 56*r* which is formed on the first resist layer 50*r* is peeled off and removed, and a portion of the red light-emitting material layer 56*r* which is formed on the hole transport layer 33 remains as the red light-emitting layer 35*r*.

Figure 15:
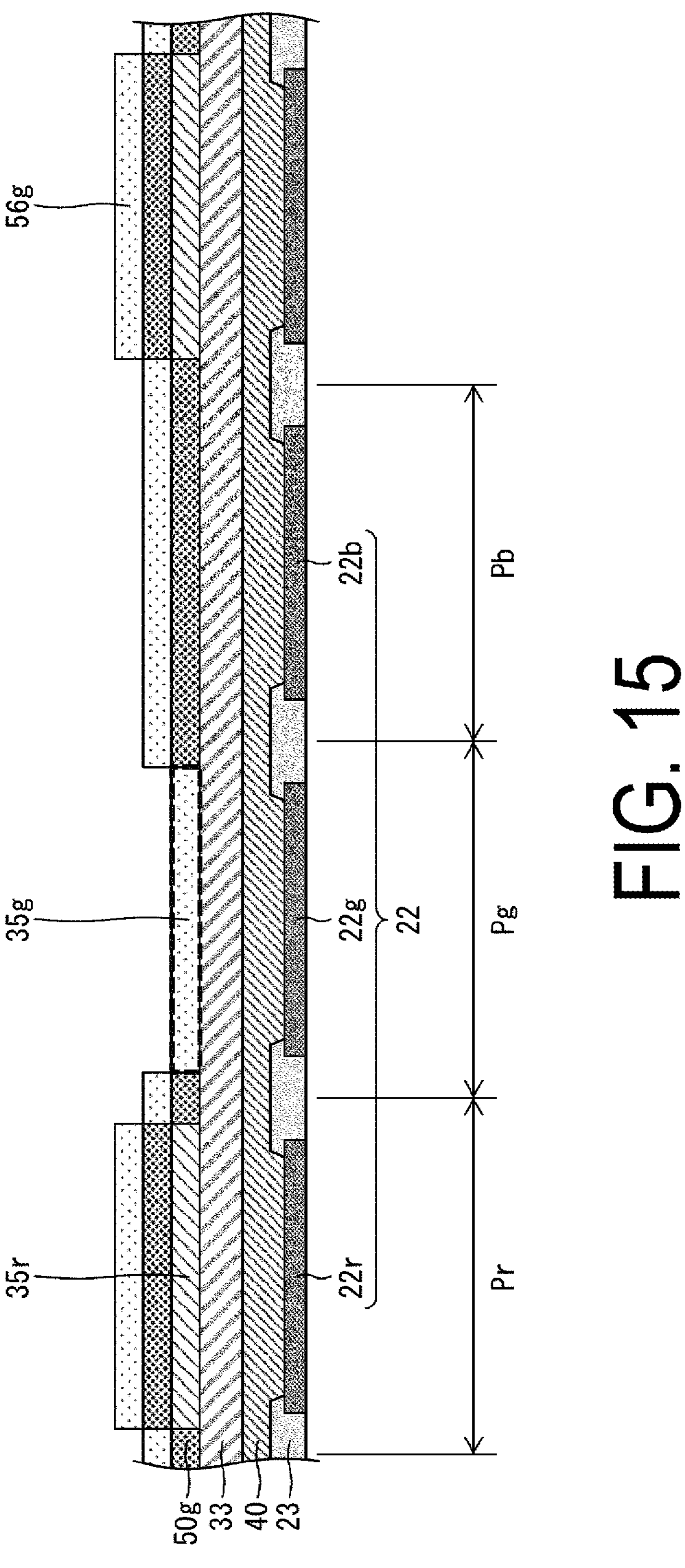
FIG. 15 is a schematic cross-sectional view illustrating an example of the process of forming the light-emitting element layer illustrated in FIG. 3.

As illustrated in FIGS. 7 and 15, subsequently, as in step S28*g*, a second resist layer 50*g* is formed (step S50), the second resist layer 50*g* is partially exposed (step S52), the second resist layer 50*g* is developed using a developing solution (step S54), and a green light-emitting material layer 56*g* containing a light-emitting material that emits green light is formed (step S56). Next, the second resist layer 50*g* is removed using a stripping solution (step S58), and a portion of the green light-emitting material layer 56*g* which is formed on the hole transport layer 33 remains as the green light-emitting layer 35*g*.

Figure 16:
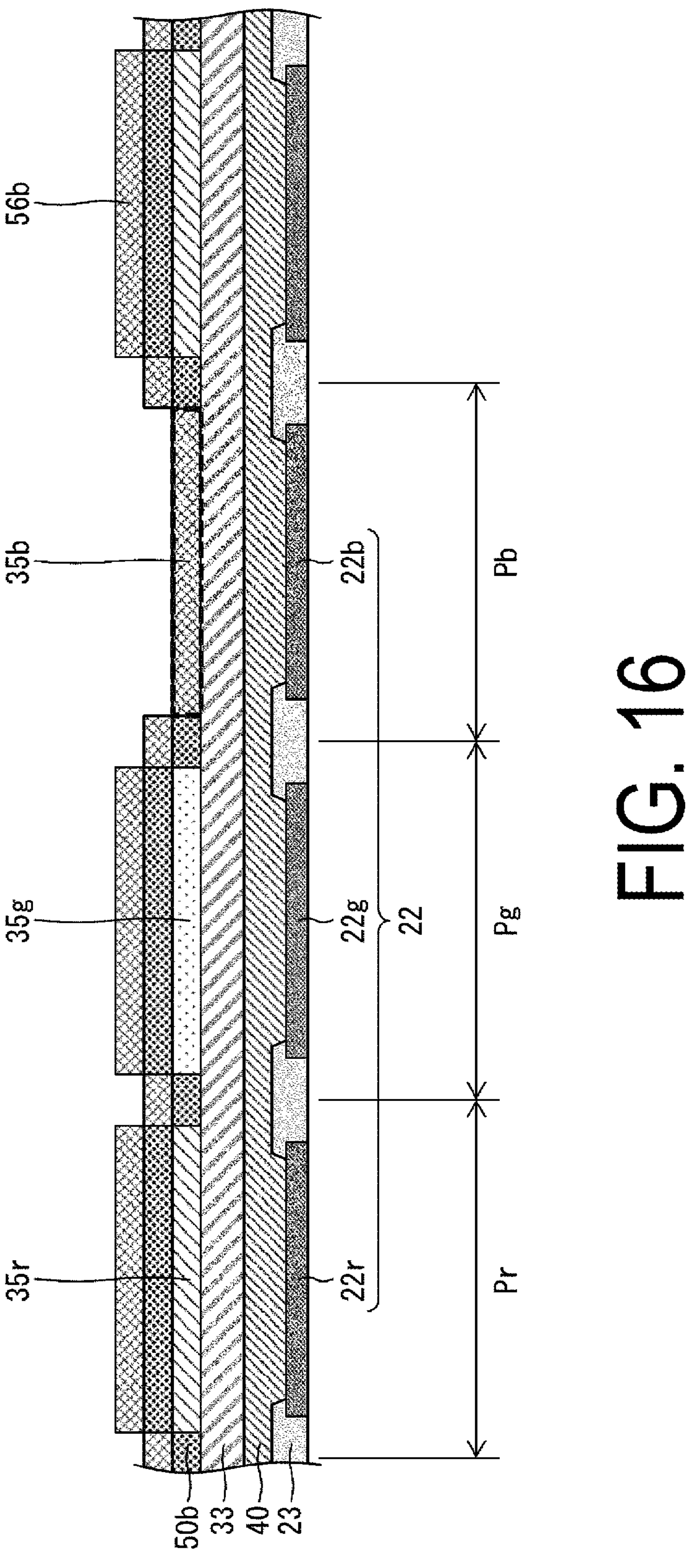
FIG. 16 is a schematic cross-sectional view illustrating an example of the process of forming the light-emitting element layer illustrated in FIG. 3.

As illustrated in FIGS. 7 and 16, subsequently, as in step S28*b*, a third resist layer 50*b* is formed (step S50), the third resist layer 50*b* is partially exposed (step S52), the third resist layer 50*b* is developed using a developing solution (step S54), and a blue light-emitting material layer 56*b* containing a light-emitting material that emits blue light is formed (step S56). Next, the third resist layer 50*b* is removed using a stripping solution (step S58), and a portion of the blue light-emitting material layer 56*b* which is formed on the hole transport layer 33 remains as the blue light-emitting layer 35*b*.

As illustrated in FIG. 5, after steps S28*r*, S28*g*, and S28*b*, the electron transport layer 37 is formed (step S30), and a cathode is formed as the common electrode 25 (step S32).

Through the above, the light-emitting element layer 5 illustrated in FIG. 3 can be formed.

First Modification Example

Any one or more of the methods of forming the red light-emitting layer 35*r*, the green light-emitting layer 35*g*, and the blue light-emitting layer 35*b* may be another method using a photolithography technique.

Figure 17:
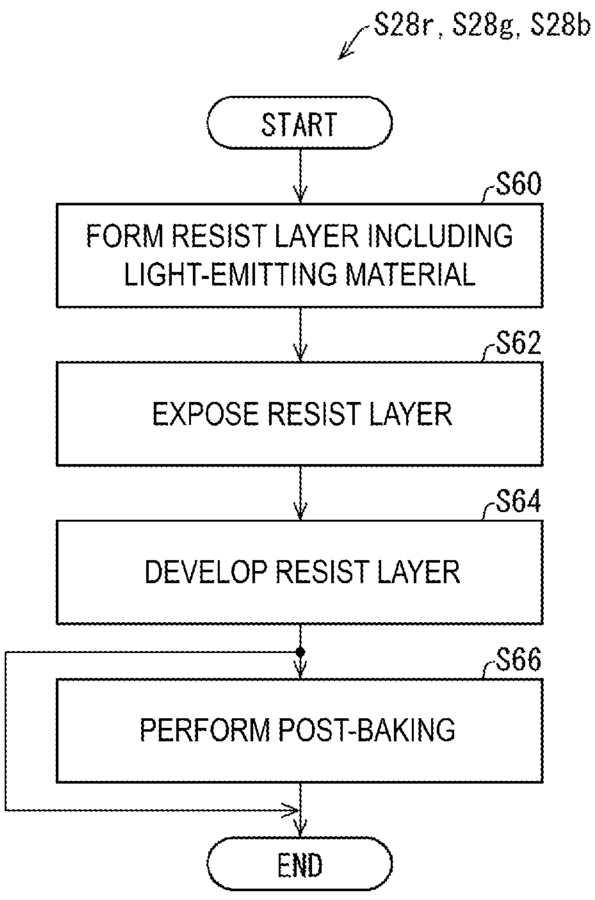
FIG. 17 is a flowchart illustrating another example of a process of forming the light-emitting layer illustrated in FIG. 3.
Figure 18:
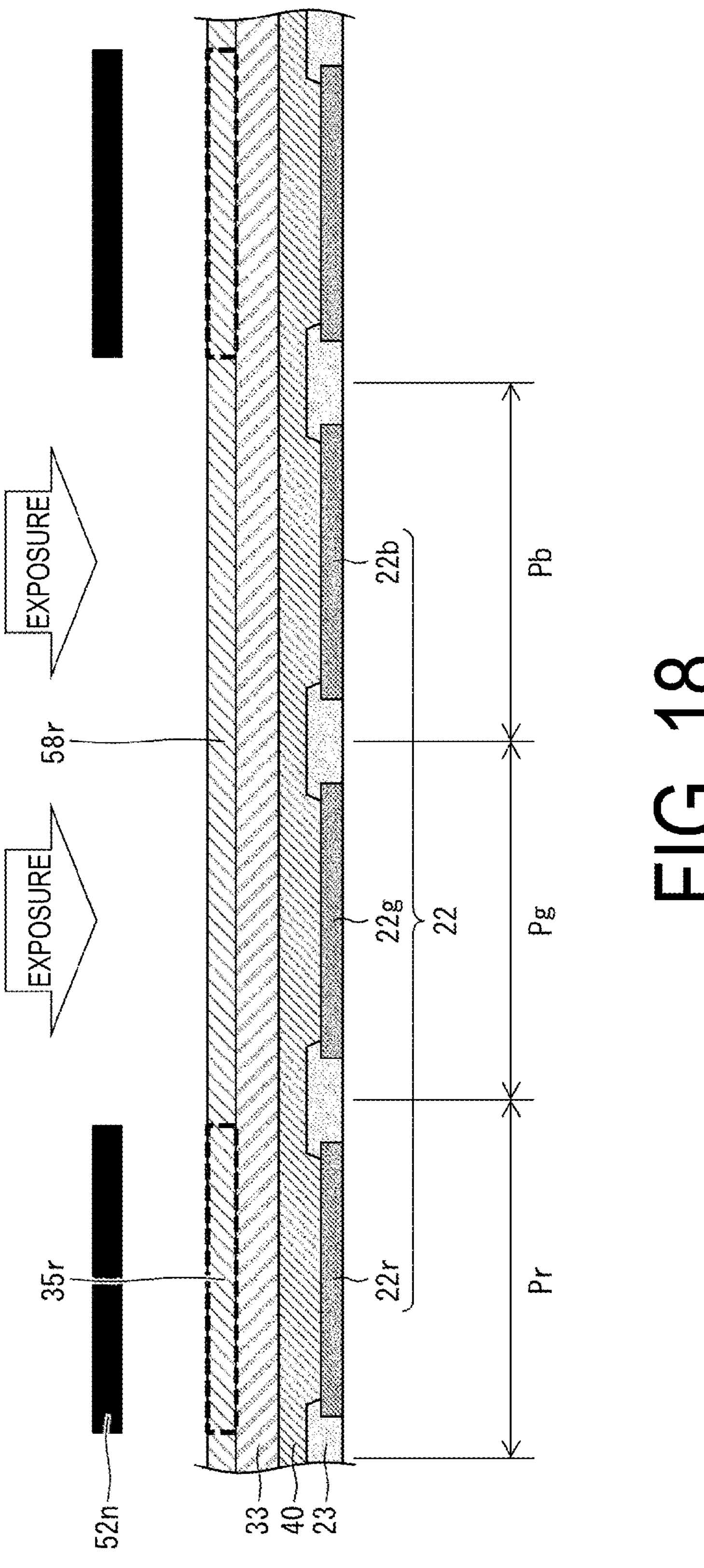
FIG. 18 is a schematic cross-sectional view illustrating another example of a process of forming the light-emitting element layer illustrated in FIG. 3.
Figure 19:
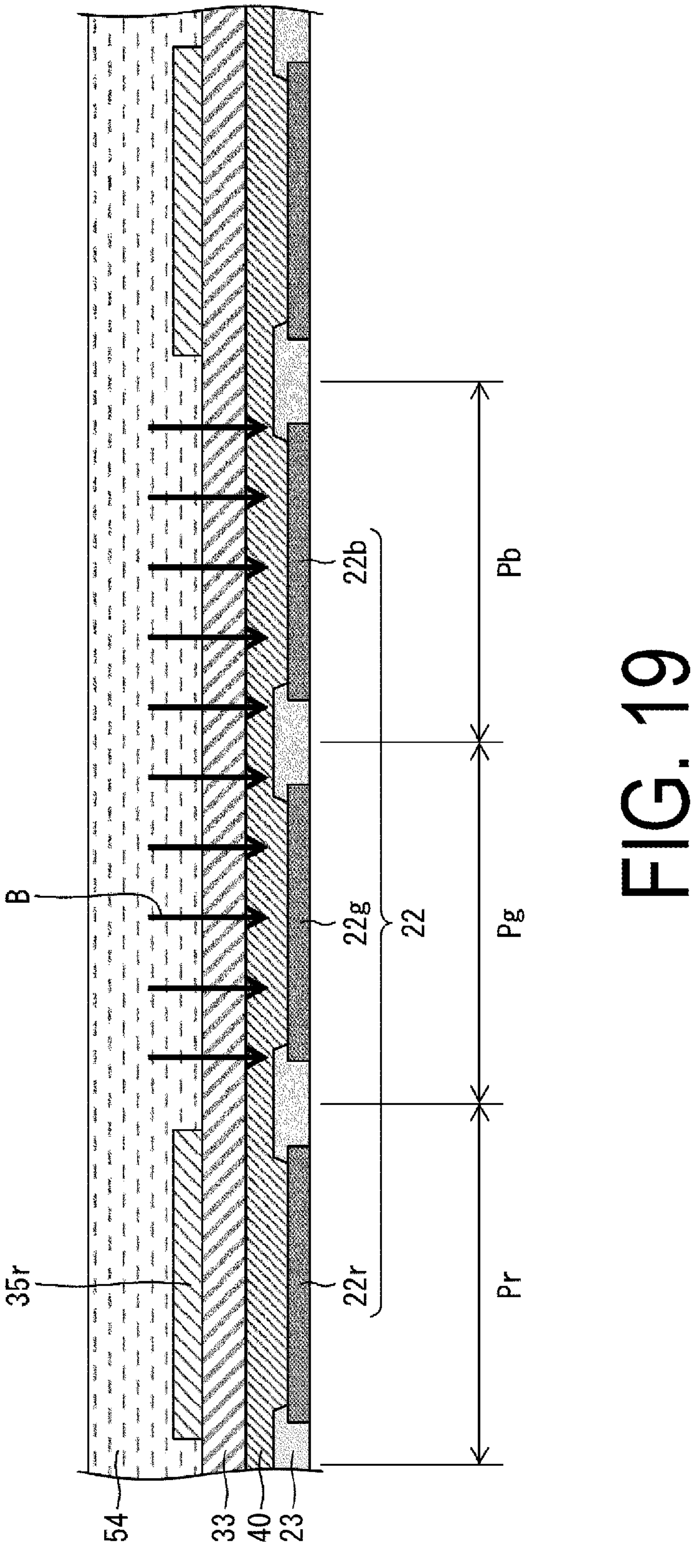
FIG. 19 is a schematic cross-sectional view illustrating another example of a process of forming the light-emitting element layer illustrated in FIG. 3.

In step S28*r*, the red light-emitting layer 35*r* may be formed as illustrated in FIGS. 17 to 19.

FIG. 17 is a flowchart illustrating another example of a process of forming the light-emitting layer illustrated in FIG. 3. FIGS. 18 and 19 are schematic cross-sectional views illustrating another example of a process of forming the light-emitting element layer illustrated in FIG. 3.

As illustrated in FIGS. 17 and 18, first, a red resist layer 58*r* containing a red light-emitting material is formed (step S60), and the red resist layer 58*r* is partially exposed (step S62).

In step S60, the red resist layer 58*r* contains a red light-emitting material and a positive resist or a negative resist. Step S60 is executed, for example, by applying a positive resist or a negative resist in which a red light-emitting material and a solvent are mixed to the hole transport layer 33 and performing pre-baking thereon at approximately 70° C. to 100° C.

In step S62, the red resist layer 58*r* is partially exposed such that a portion of the red resist layer 58*r* in the red subpixel Pr is insoluble in a developing solution and portions of the first resist layer 50_r_ in the green subpixel Pg and the blue subpixel Pb are soluble in the developing solution. When the red resist layer 58_r_ includes a positive resist, the red resist layer 58_r_ is exposed using a mask 52_n_ in which optical openings are provided at positions corresponding to the green subpixel Pg and the blue subpixel Pb. On the other hand, when the red resist layer 58_r_ includes a negative resist, the red resist layer 58_r_ is exposed using the mask 52_p_ (see FIG. 11) in which optical openings are provided at positions corresponding to the red subpixels Pr.

Next, as illustrated in FIGS. 17 and 19, the red resist layer 58_r_ is developed using the developing solution 54 (step S64). The portions of the red resist layer 58_r_ in the green subpixel Pg and the blue subpixel Pb are dissolved in the developing solution 54 and removed. As a result, as indicated by arrows B in FIG. 19, in the green subpixel Pg and the blue subpixel Pb, the developing solution 54 reaches the hole transport layer 33 and further reaches the hole injection layer 40 through the hole transport layer 33.

As described above, the PEDOT/PSS 42 tends to deteriorate due to an alkaline solution. For this reason, in a comparative example in which a hole injection layer does not contain a polymer, PEDOT/PSS deteriorates, and hole injection efficiency of the hole injection layer is lowered. In contrast, according to the configuration of the disclosure in which the hole injection layer 40 contains the polymer 44_p_, the PEDOT/PSS 42 is protected by the polymer 44_p_, and thus the PEDOT/PSS 42 is less likely to deteriorate. Thus, in the configuration of the disclosure, the deterioration of the hole injection layer in step S64 is reduced, and thus it is possible to improve luminous efficiency of the green subpixel Pg and the blue subpixel Pb as compared to the comparative example.

In addition, the portion of the red resist layer 58_r_ in the red subpixel Pr remains as the red light-emitting layer 35_r_.

Next, as illustrated in FIG. 17, it is preferable to post-bake the red light-emitting layer 35_r_ (step S66) as necessary to complete the curing of the red light-emitting layer 35_r_.

Similarly, the processing illustrated in FIG. 17 may also be performed in step S28_g_ and step S28_b_.

Second Modification Example

Any one or more of the methods of forming the red light-emitting layer 35_r_, the green light-emitting layer 35_g_, and the blue light-emitting layer 35_b_ may be still another method using a photolithography technique.

In step S28_r_, the red light-emitting layer 35_r_ may be formed as illustrated in FIGS. 20 to 23.

Figure 20:
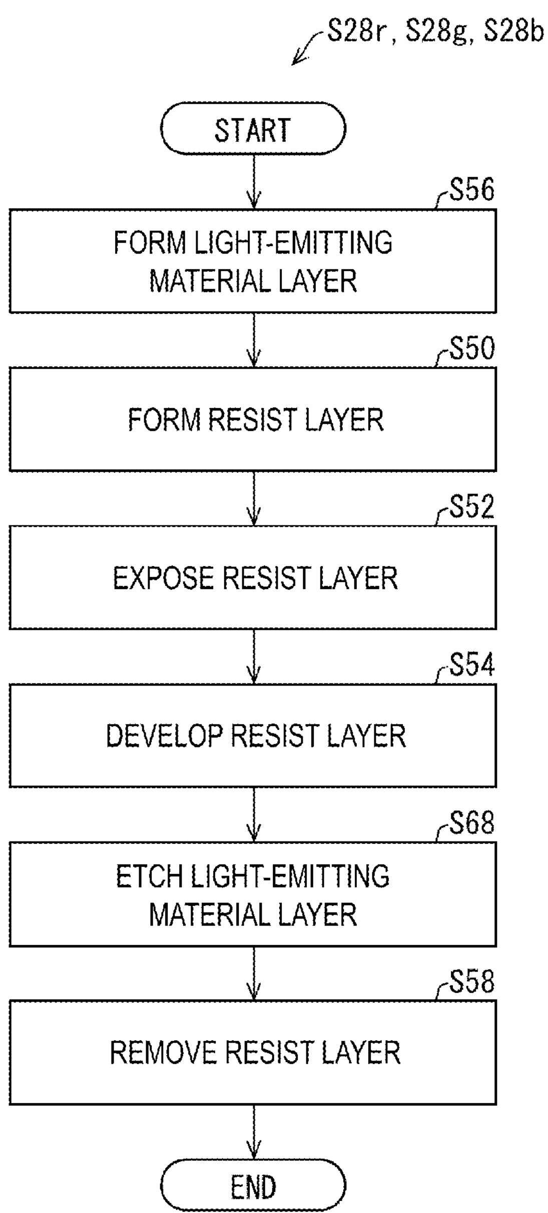
FIG. 20 is a flowchart illustrating still another example of a process of forming the light-emitting layer illustrated in FIG. 3.
Figure 21:
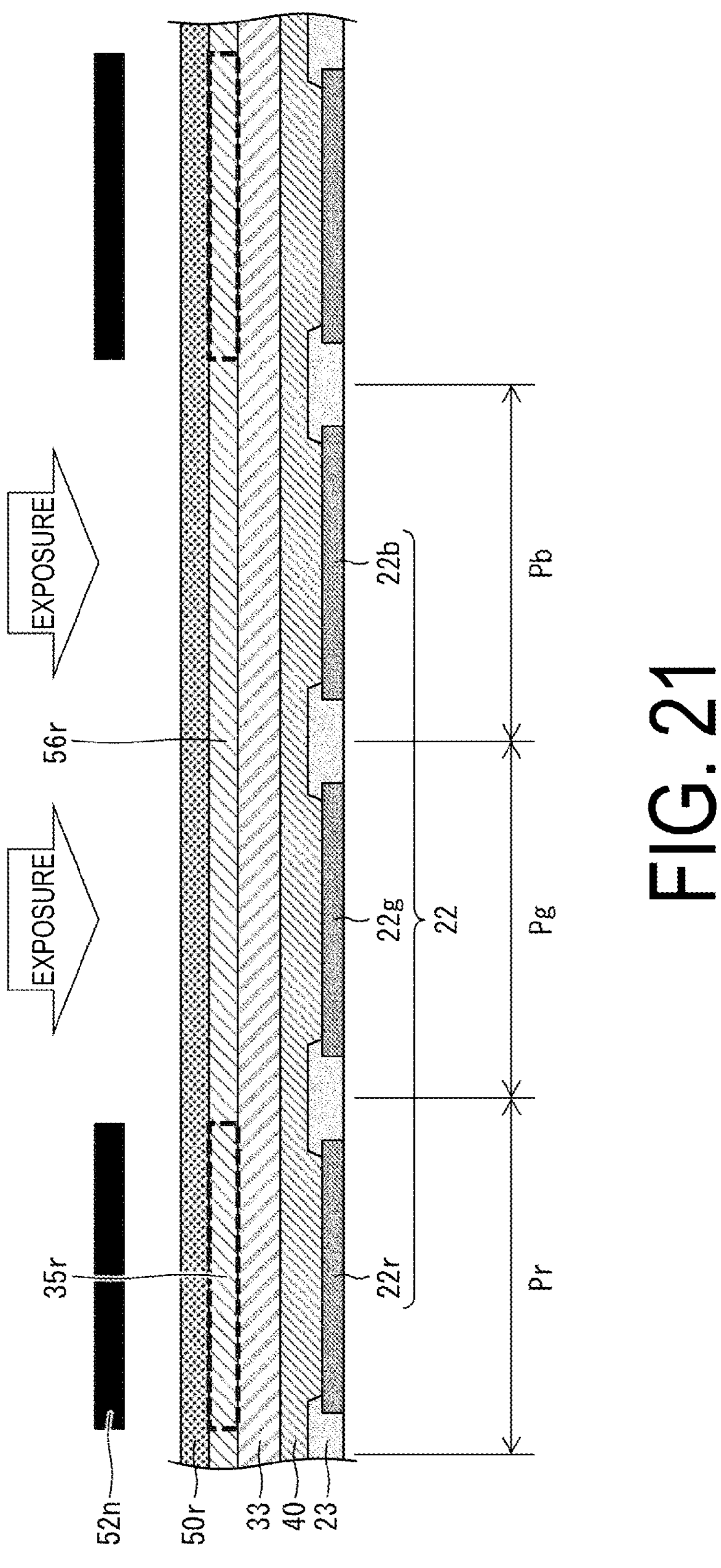
FIG. 21 is a schematic cross-sectional view illustrating still another example of a process of forming the light-emitting element layer illustrated in FIG. 3.
Figure 22:
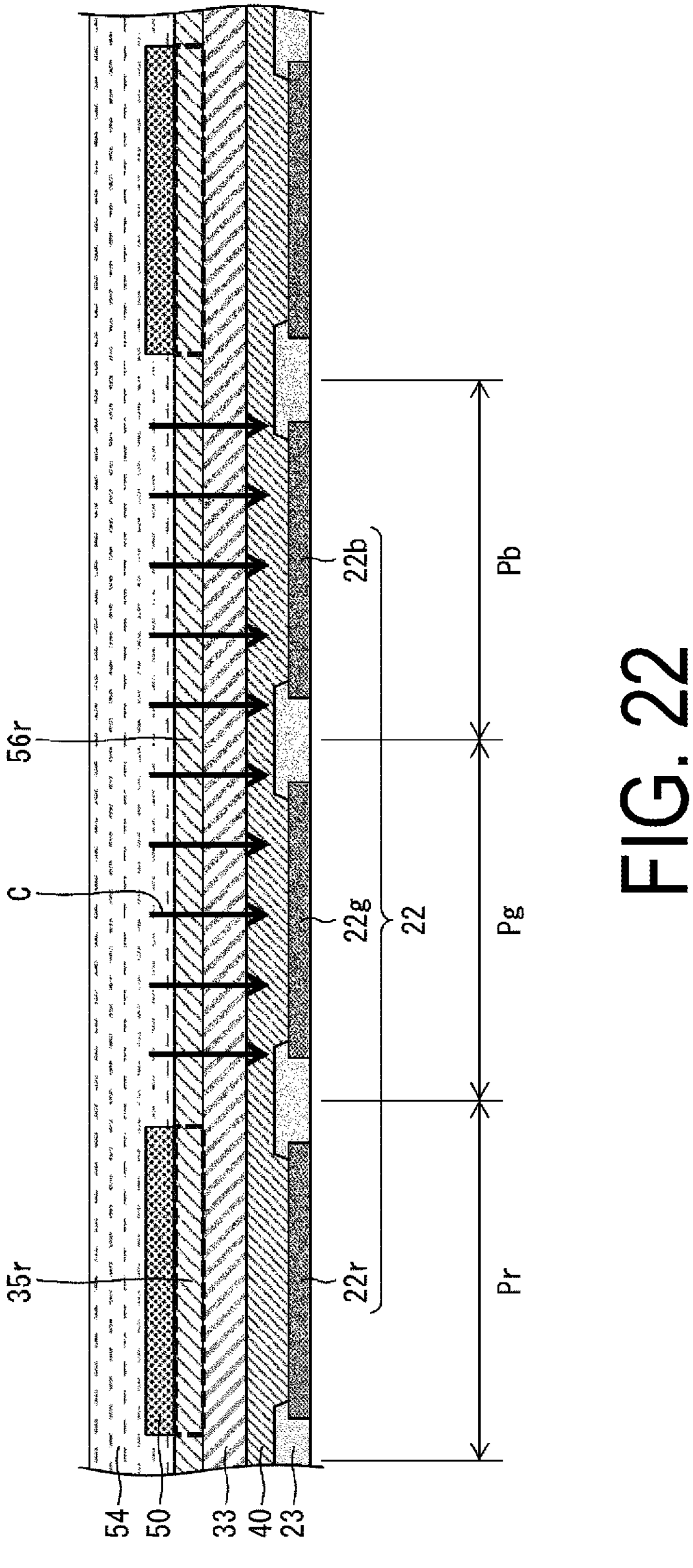
FIG. 22 is a schematic cross-sectional view illustrating still another example of a process of forming the light-emitting element layer illustrated in FIG. 3.
Figure 23:
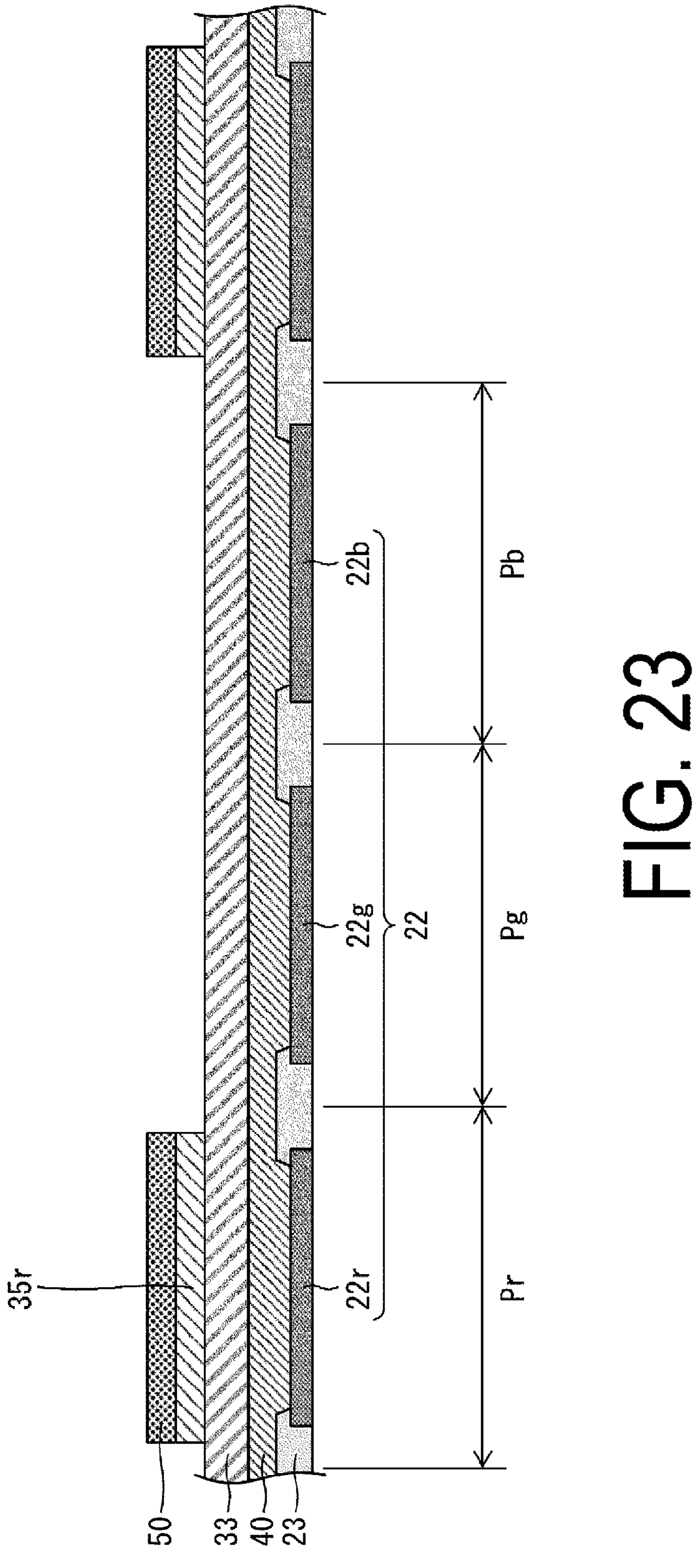
FIG. 23 is a schematic cross-sectional view illustrating still another example of a process of forming the light-emitting element layer illustrated in FIG. 3.

FIG. 20 is a flowchart illustrating still another example of a process of forming the light-emitting layer illustrated in FIG. 3. FIGS. 21 to 23 are schematic cross-sectional views illustrating another example of a process of forming the light-emitting element layer illustrated in FIG. 3.

As illustrated in FIGS. 20 and 21, the red light-emitting material layer 56_r_ is formed (step S56), the first resist layer 50_r_ is formed (step S50), and the first resist layer 50_r_ is partially exposed (step S52).

In step S52, the first resist layer 50_r_ is partially exposed such that a portion of the first resist layer 50_r_ in the red subpixel Pr is insoluble in a developing solution and portions of the first resist layer 50_r_ in the green subpixel Pg and the blue subpixel Pb are soluble in the developing solution. When the first resist layer 50_r_ includes a positive resist, the first resist layer 50_r_ is exposed using the mask 52_n_ in which optical openings are provided at positions corresponding to the green subpixel Pg and the blue subpixel Pb. On the other hand, when the first resist layer 50_r_ includes a negative resist, the first resist layer 50_r_ is exposed using the mask 52_p_ (see FIG. 11) in which optical openings are provided at positions corresponding to the red subpixels Pr.

Next, as illustrated in FIGS. 20 and 22, the first resist layer 50 is developed using the developing solution 54 (step S54). The portions of the first resist layer 50_r_ in the green subpixel Pg and the blue subpixel Pb are dissolved in the developing solution 54 and removed. As a result, as indicated by arrows C in FIG. 22, in the green subpixel Pg and the blue subpixel Pb, the developing solution 54 reaches the red light-emitting material layer 56_r_ and the hole transport layer 33 and further reaches the hole injection layer 40 through the hole transport layer 33.

As described above, the PEDOT/PSS 42 tends to deteriorate due to an alkaline solution. For this reason, in a comparative example in which a hole injection layer does not contain a polymer, PEDOT/PSS deteriorates, and hole injection efficiency of the hole injection layer is lowered. In contrast, according to the configuration of the disclosure in which the hole injection layer 40 contains the polymer 44_p_, the PEDOT/PSS 42 is protected by the polymer 44_p_, and thus the PEDOT/PSS 42 is less likely to deteriorate. Thus, in the configuration of the disclosure, the deterioration of the hole injection layer in step S54 is reduced, and thus it is possible to improve luminous efficiency of the green subpixel Pg and the blue subpixel Pb as compared to the comparative example.

Next, as illustrated in FIGS. 20 and 23, the red light-emitting material layer 56_r_ is etched using the first resist layer 50_r_ as a mask (step S68). In consideration of deterioration of the red light-emitting material layer 56_r_ due to etching, it is preferable that wet etching be used for etching rather than dry etching. In the case of wet etching, a solvent in which the light-emitting material contained in the red light-emitting material layer 56_r_ is soluble can be used as an etchant. In addition, the etchant may be the same as the solvent contained in the raw material of the red light-emitting material layer 56_r_. As a result, a portion of the red light-emitting material layer 56_r_ which is exposed from the first resist layer 50_r_ is removed. On the other hand, a portion of the red light-emitting material layer 56_r_ which is covered with the first resist layer 50_r_ remains as the red light-emitting layer 35_r_. Next, the first resist layer 50_r_ is removed using the stripping solution 58 (see FIG. 14) (step S58).

Similarly, the processing illustrated in FIG. 20 may be performed in step S28_g_ and step S28_b_.

Comparative Examples and Example

Figure 24:
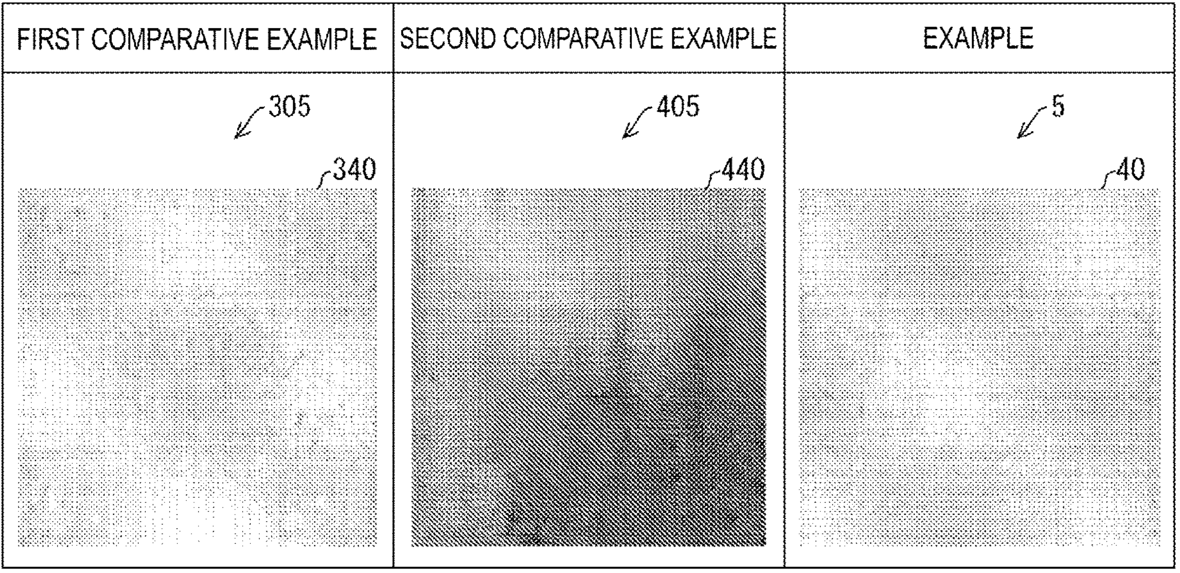
FIG. 24 is a diagram showing light-emitting states of a light-emitting element layer including a hole injection layer not containing a polymer according to a comparative example and a light-emitting element layer including a hole injection layer containing a polymer according to an example of the disclosure.

FIG. 24 is a diagram showing a light-emitting state of a light-emitting element layer 305, according to a first comparative example, including a hole injection layer 340 that does not contain a polymer and is not immersed in a TMAH solution, a light-emitting state of a light-emitting element layer 405, according to a second comparative example, including a hole injection layer 440 that does not contain a polymer and is immersed in a TMAH solution, and a light-emitting state of the light-emitting element layer 5, according to the example of the disclosure, including the hole injection layer 40 that contains the polymer 44_p_ and is immersed in a TMAH solution. FIG. 24 shows micrographs.

Here, the hole injection layer 340 according to the first comparative example has the same configuration as the hole injection layer 40 according to the disclosure except that the hole injection layer 340 does not contain a polymer and is not immersed in a TMAH solution. In addition, the hole injection layer 440 according to the second comparative example has the same configuration as the hole injection layer 40 according to the disclosure except that the hole injection layer 440 does not contain a polymer. In addition, the light-emitting element layers 305 and 405 according to the first and second comparative examples, respectively, have the same configuration as the light-emitting element layer 5 according to the disclosure except for the hole injection layers 340 and 440. Further, the hole injection layers 440 and 40 are immersed in a 0.8% TMAH solution for 60 seconds without a film covering the hole injection layers 440 and 40.

As shown in a left drawing of FIG. 24, the entire electrode of the light-emitting element layer 305 according to the first comparative example exhibits uniform and bright electroluminescence (hereinafter referred to as "EL light emission"). This indicates that since the hole injection layer 340 according to the first comparative example is not immersed in a TMAH solution, the PEDOT/PSS contained in the hole injection layer 340 according to the first comparative example does not deteriorate.

As shown in a middle drawing of FIG. 24, the upper left side of the electrode of the light-emitting element layer 405 according to the second comparative example exhibits bright EL light emission, but the lower right side of the electrode thereof exhibits dark EL light emission or does not exhibit light emission. In this dark portion, the PEDOT/PSS contained in the hole injection layer 440 according to the second comparative example deteriorates due to the TMAH solution and thus little or no hole injection from the hole injection layer 440 occurs. Thus, this dark portion indicates substantially no EL light emission due to recombination of electrons and holes occurs in the portion.

As shown in the drawing on the right side of FIG. 24, the entire electrode of the light-emitting element layer 5 according to the disclosure is bright. This indicates that there is substantially no deterioration of the PEDOT/PSS contained in the hole injection layer 40 according to the disclosure even after the hole injection layer 40 is immersed in the TMAH solution.

Thus, according to the configuration of the disclosure, it is possible to prevent the PEDOT/PSS contained in the hole injection layer 40 from deteriorating due to the TMAH solution.

Second Embodiment

Another embodiment of the disclosure will be described below. Note that, for convenience of description, members having the same functions as those of the members described in the above-described embodiment will be denoted by the same reference numerals and signs, and the description thereof will not be repeated.

Figure 25:
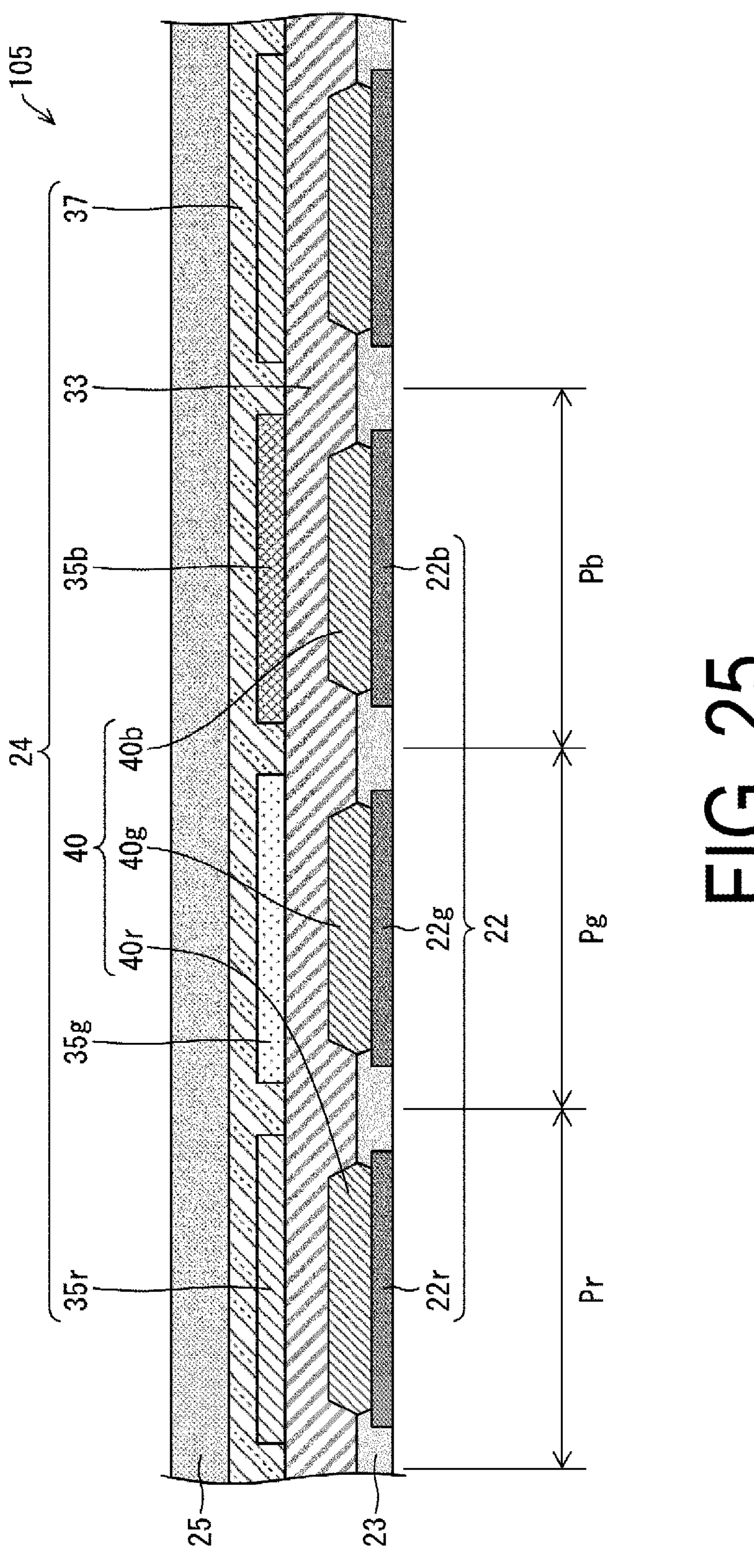
FIG. 25 is a schematic cross-sectional view illustrating a non-limiting example of a configuration in a display region of a light-emitting element layer according to another embodiment of the disclosure.

FIG. 25 is a schematic cross-sectional view illustrating a non-limiting example of a configuration in a display region of the light-emitting element layer 105 according to the present embodiment.

As illustrated in FIG. 25, the light-emitting element layer 105 according to the present embodiment is the same as the light-emitting element layer 5 according to the above-described embodiment except that the hole injection layer 40 is divided into a red hole injection layer 40*r* (first portion), a green hole injection layer 40*g* (second portion), and a blue hole injection layer 40*b* (third portion).

The red hole injection layer 40*r* is a portion of the hole injection layer 40 which overlaps the red pixel electrode 22*r*. The green hole injection layer 40*g* is a portion of the hole injection layer 40 which overlaps the green pixel electrode 22*g*. The blue hole injection layer 40*b* is a portion of the hole injection layer 40 which overlaps the blue pixel electrode 22*b*.

The red hole injection layer 40*r*, the green hole injection layer 40*g*, and the blue hole injection layer 40*b* are separated from each other. For this reason, a leakage current through the hole injection layer 40 between the red subpixel Pr, the green subpixel Pg, and the blue subpixel Pb is reduced.

Process of Forming Light-Emitting Element Layer

A process of forming the light-emitting element layer 105 according to the present embodiment is the same as the process of forming the light-emitting element layer 5 according to the first embodiment described above except for the process of forming the hole injection layer 40.

A process of forming the hole injection layer 40 according to the present embodiment (step S24) will be described below with reference to FIGS. 26 to 28.

Figure 26:
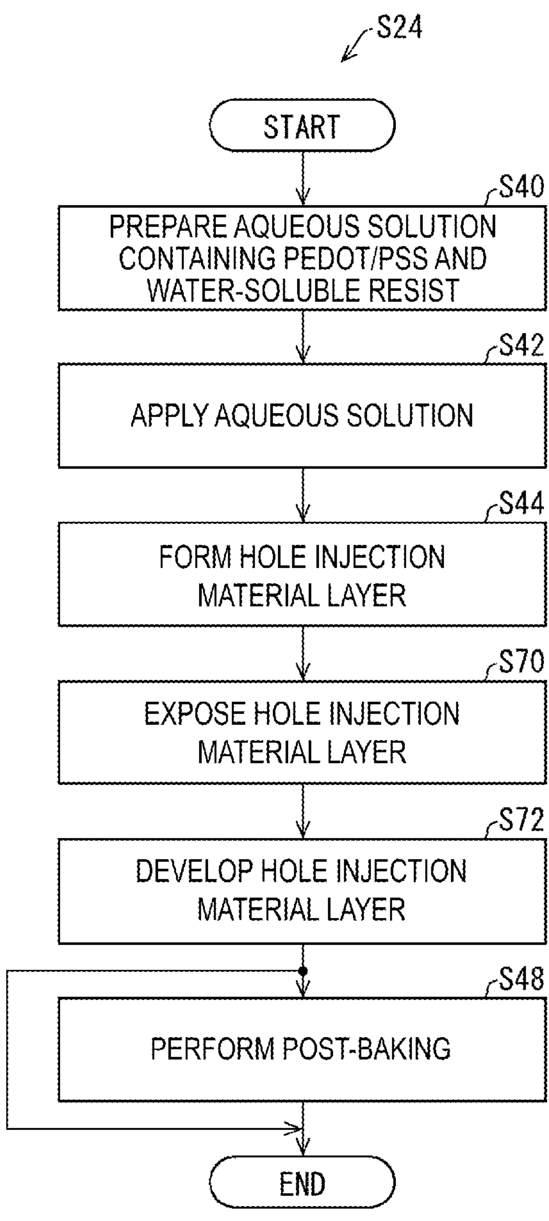
FIG. 26 is a flowchart illustrating an example of a process of forming a hole injection layer illustrated in FIG. 25.

FIG. 26 is a flowchart illustrating an example of a process of forming the hole injection layer 40 illustrated in FIG. 25. FIGS. 27 and 28 are schematic cross-sectional views illustrating an example of a process of forming the hole injection layer 40 illustrated in FIG. 25.

As illustrated in FIG. 26, first, step S40, step S42, and step S44 are performed as in the above-described embodiment.

Figure 27:
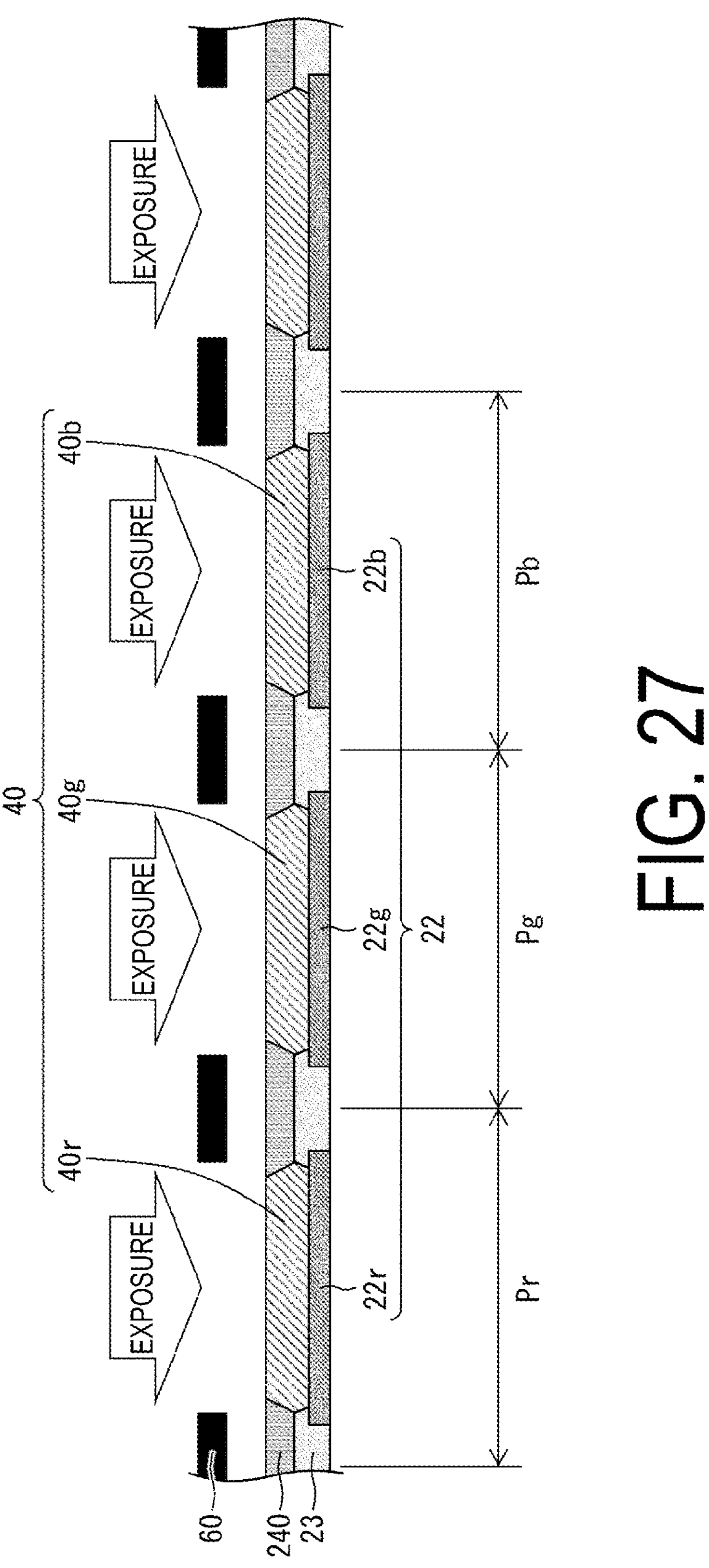
FIG. 27 is a schematic cross-sectional view illustrating an example of a process of forming the light-emitting element layer illustrated in FIG. 25.

Next, as illustrated in FIGS. 26 and 27, the hole injection material layer 240 is partially exposed (step S70). In step S70, the hole injection material layer 240 is partially exposed such that portions of the hole injection material layer 240 corresponding to the red pixel electrodes 22*r*, the green pixel electrode 22*g*, and the blue pixel electrode 22*b* are insoluble in water and a portion of the hole injection material layer 240 corresponding to the edge cover 23 is soluble in water. For this reason, when the water-soluble photoresist 64 contained in the hole injection material layer 240 is a negative resist, the hole injection material layer 240 is exposed using a mask 60 in which optical openings are provided at positions corresponding to the pixel electrodes 22. The water-soluble photoresist 64 contained in the hole injection material layer 240 is cured by the exposure.

Figure 28:
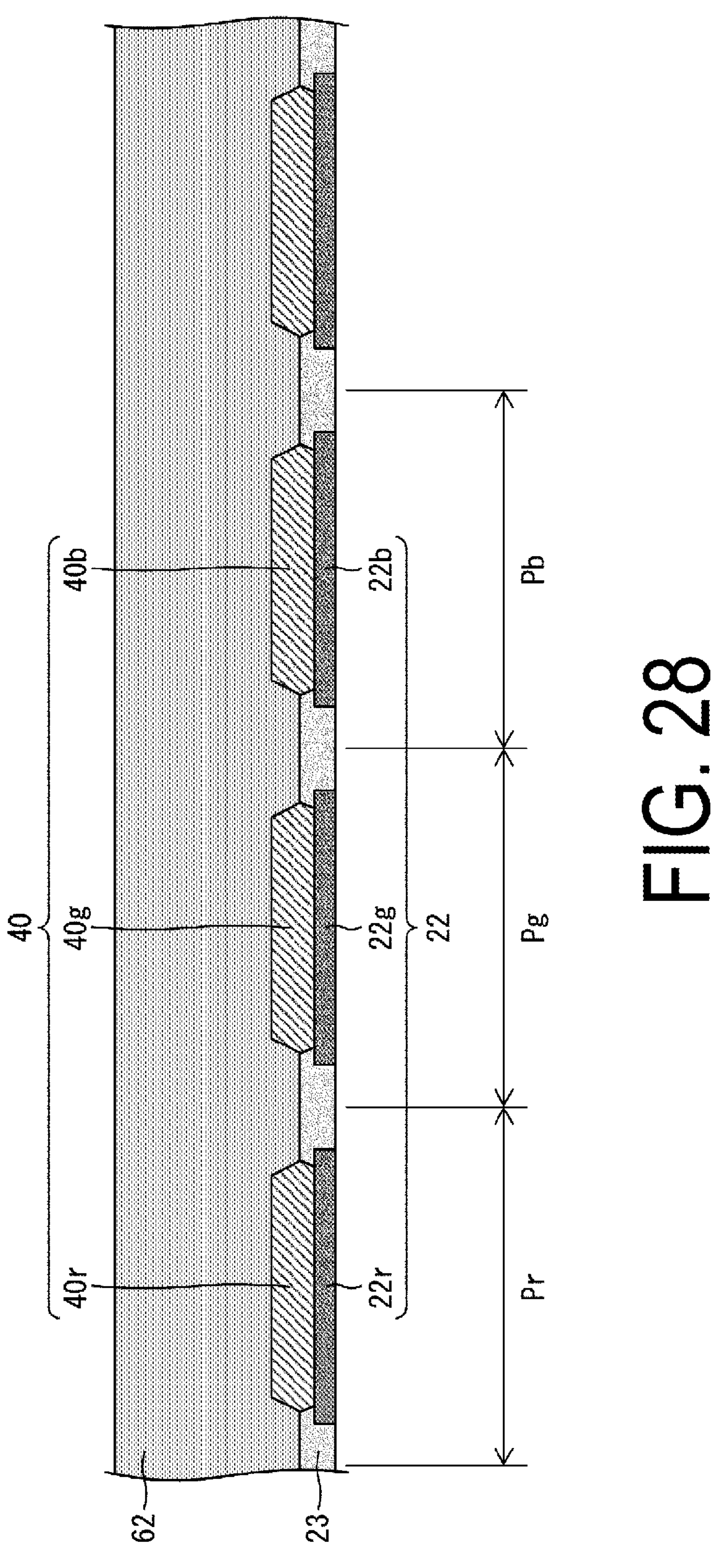
FIG. 28 is a schematic cross-sectional view illustrating an example of the process of forming the light-emitting element layer illustrated in FIG. 25.

Next, as illustrated in FIGS. 26 and 28, the hole injection material layer 240 is developed using water 62 (step S72). A portion of the hole injection material layer 240 corresponding to the pixel electrode 22 remains as the hole injection layer 40. On the other hand, a portion of the hole injection material layer 240 corresponding to the edge cover 23 is dissolved in the water 62 and removed. By the removal, the red hole injection layer 40*r*, the green hole injection layer 40*g*, and the blue hole injection layer 40*b* are separated from each other.

As illustrated in FIG. 27, the hole injection layer 40 may further be post-baked to complete curing of the hole injection layer 40 as necessary (step S48).

Third Embodiment

Another embodiment of the disclosure will be described below. Note that, for convenience of description, members having the same functions as those of the members described in the above-described embodiment will be denoted by the same reference numerals and signs, and the description thereof will not be repeated.

Figure 29:
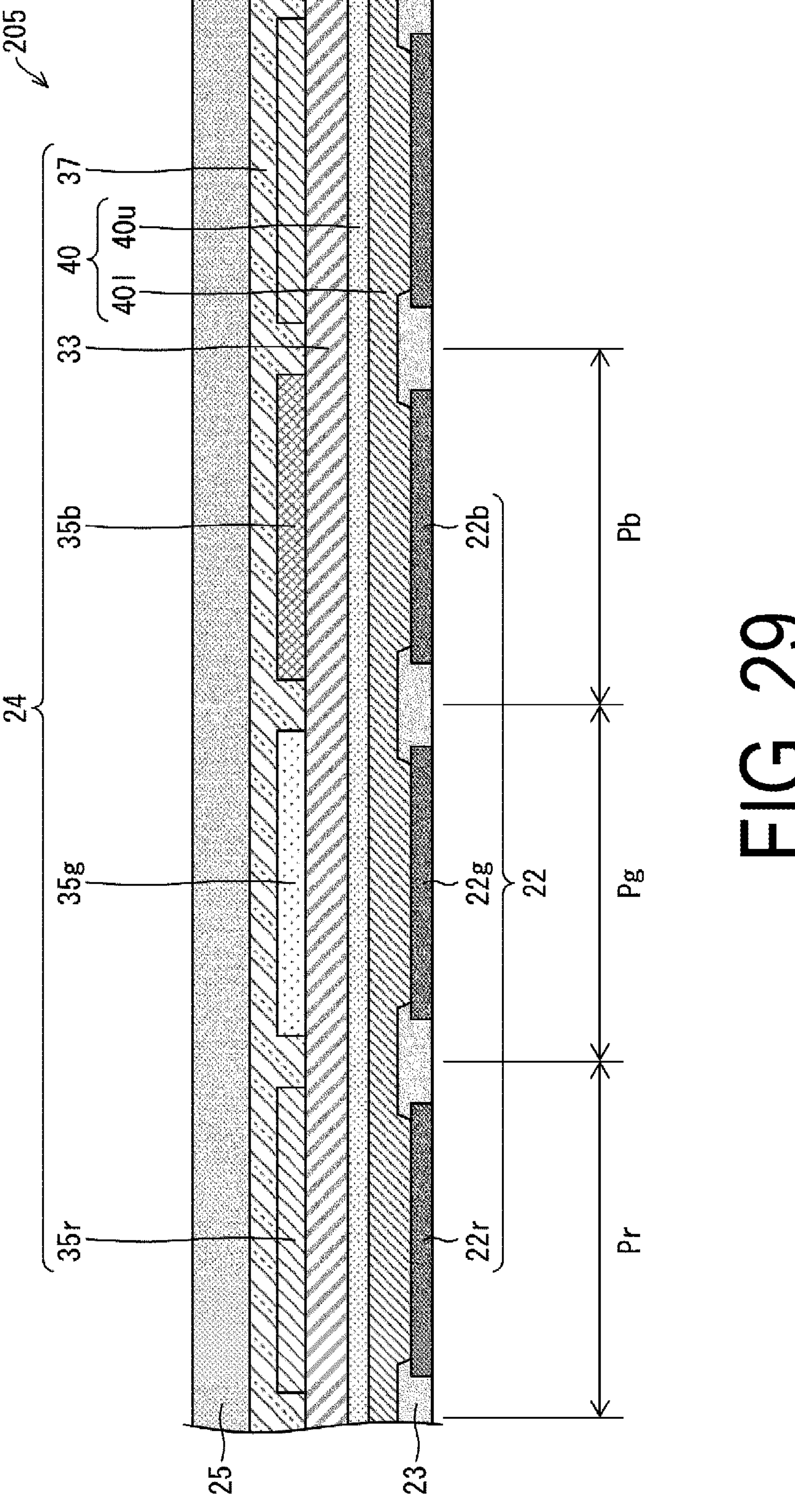
FIG. 29 is a schematic cross-sectional view illustrating a non-limiting example of a configuration in a display region of the light-emitting element layer according to another embodiment of the disclosure.

FIG. 29 is a schematic cross-sectional view illustrating a non-limiting example of a configuration in a display region of the light-emitting element layer 205 according to the present embodiment.

As illustrated in FIG. 29, the light-emitting element layer 205 according to the present embodiment is the same as the light-emitting element layer 5 according to the above-described embodiment except that the hole injection layer 40 is a multilayer including a lower layer 401 and an upper layer 40*u*.

Configuration of Hole Injection Layer

Figure 30:
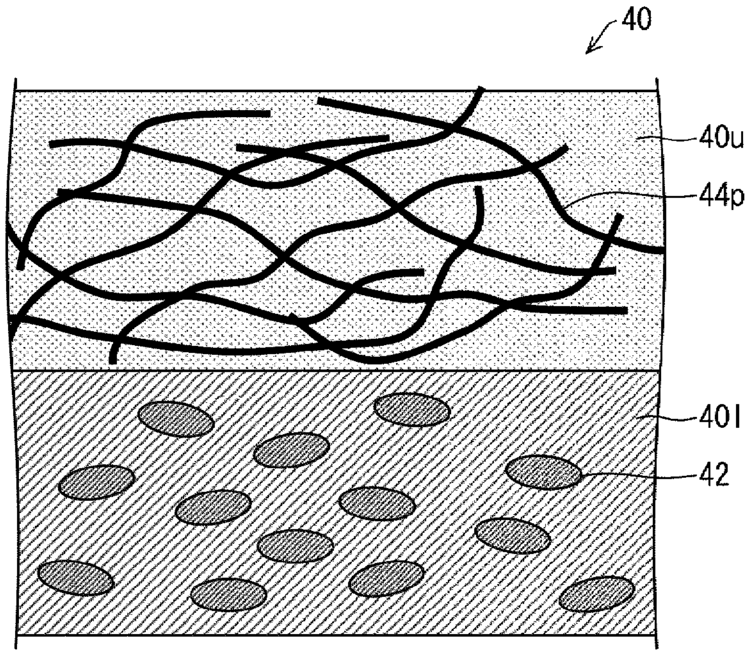
FIG. 30 is a schematic view illustrating a configuration of a hole injection layer illustrated in FIG. 29.

FIG. 30 is a schematic view illustrating a configuration of the hole injection layer 40 illustrated in FIG. 29.

As illustrated in FIG. 30, the lower layer 401 of the hole injection layer 40 contains the PEDOT/PSS 42, the upper layer 40*u* of the hole injection layer 40 contains the polymer 44*p*, and the upper layer 40*u* covers the lower layer 401.

For this reason, the polymer 44*p* is adjacent to the PEDOT/PSS 42 in the hole injection layer 40 and can protect the PEDOT/PSS 42 against an alkaline solution that comes from above the hole injection layer 40.

It is preferable that the upper layer 40*u* be sufficiently thin so as not to prevent hole injection from the lower layer 401 to the hole transport layer 33. Specifically, it is preferable that the thickness of the upper layer 40*u* be equal to or less than 10 nm so that holes can pass through the upper layer 40*u* by a tunnel effect. Alternatively, it is preferable that the upper layer 40*u* contain a hole transport material so that the upper layer 40*u* functions as a hole transport layer.

Process of Forming Light-Emitting Element Layer

A process of forming the light-emitting element layer 205 according to the present embodiment is the same as the process of forming the light-emitting element layer 5 according to the first embodiment described above except for the process of forming the hole injection layer 40.

A process of forming the hole injection layer 40 according to the present embodiment (step S24) will be described below with reference to FIGS. 31 and 32.

Figure 31:
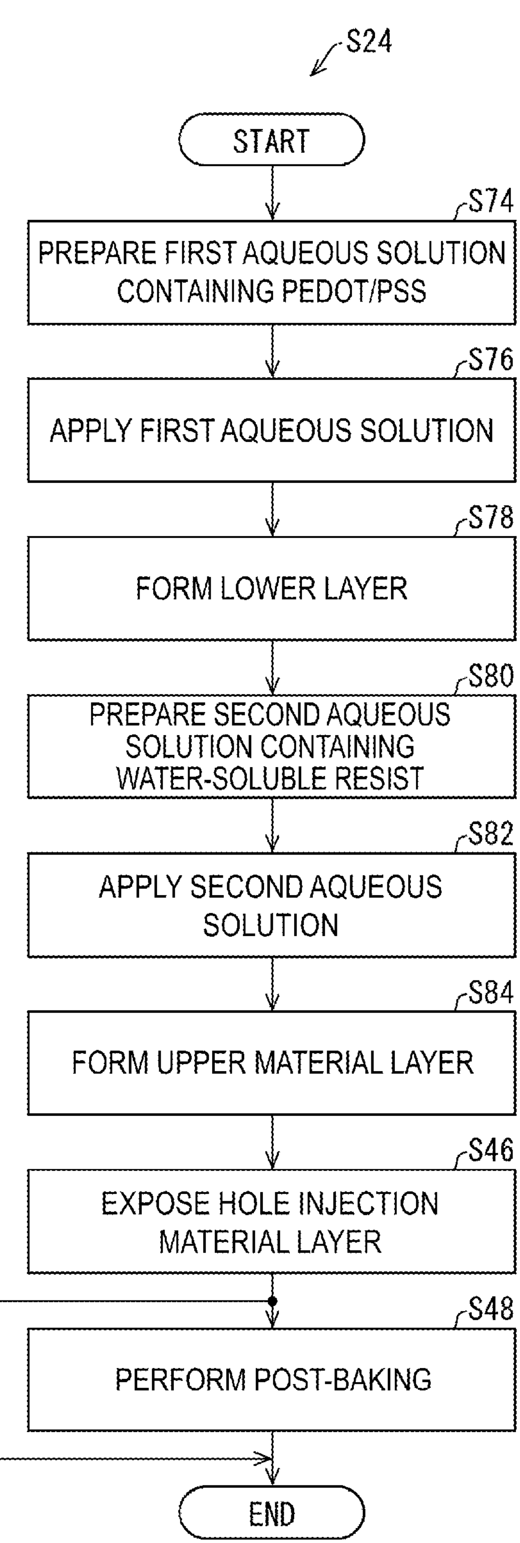
FIG. 31 is a flowchart illustrating an example of a process of forming the hole injection layer illustrated in FIG. 29.

FIG. 31 is a flowchart illustrating an example of a process of forming the hole injection layer 40 illustrated in FIG. 29. FIG. 32 is a schematic cross-sectional view illustrating an example of the process of forming the hole injection layer 40 illustrated in FIG. 29.

Figure 32:
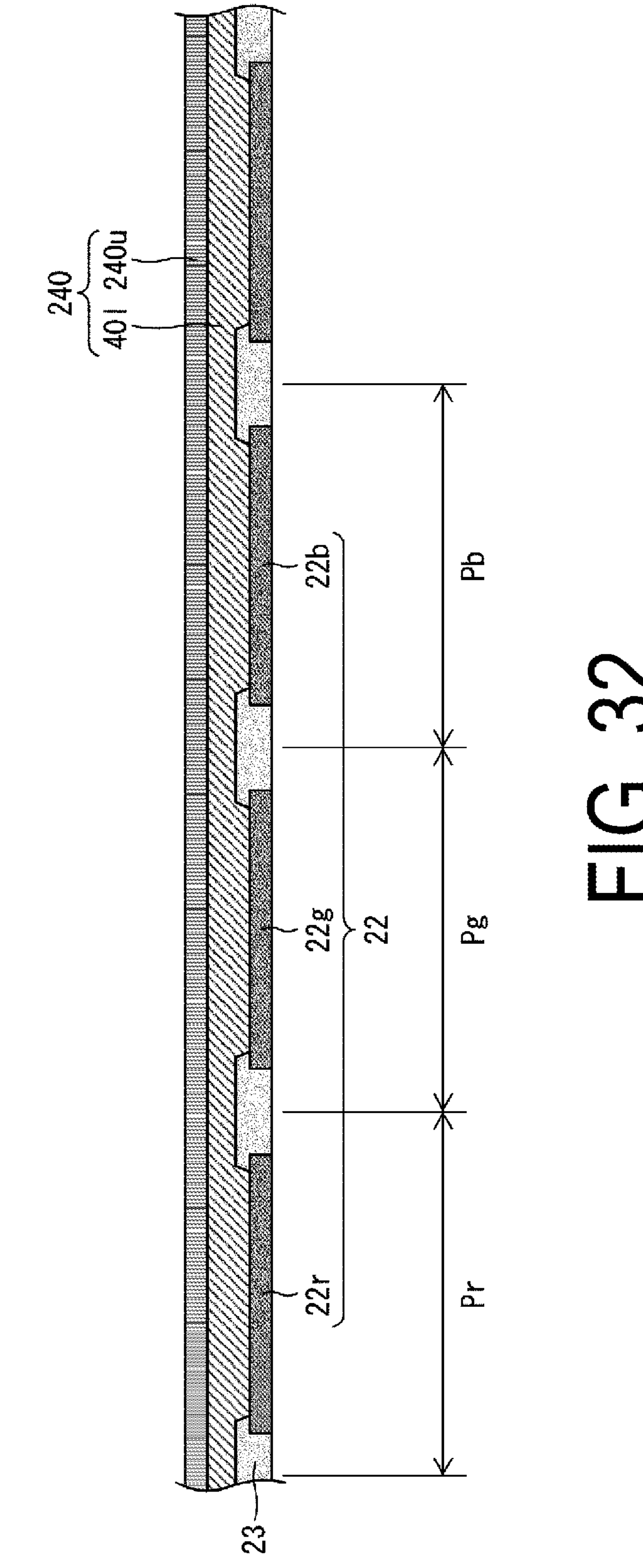
FIG. 32 is a schematic cross-sectional view illustrating an example of a process of forming the light-emitting element layer illustrated in FIG. 29.

As illustrated in FIGS. 31 and 32, a first aqueous solution containing the PEDOT/PSS 42 is prepared (step S74), and the first aqueous solution is applied onto the pixel electrode 22 and the edge cover 23 (step S76). An application method may be any method such as a bar coating method, a spin coating method, or an electrostatic spraying method. Next, a lower layer 401 is formed from the film of the first aqueous solution by baking the film of the first aqueous solution (step S78).

Next, a second aqueous solution containing the water-soluble photoresist 64 is prepared (step S80), and the second aqueous solution is applied onto the lower layer 401 (step S82). An application method may be any method such as a bar coating method, a spin coating method, or an electrostatic spraying method. Next, an upper material layer 240*u* is formed from the film of the second aqueous solution by pre-baking the film of the second aqueous solution (step S84). Consequently, the hole injection material layer 240 is formed including the lower layer 401 and the upper material layer 240*u*.

Next, the hole injection material layer 240 is exposed (step S46). By the exposure, the upper material layer 240*u* is exposed, and the water-soluble photoresist 64 contained in the upper material layer 240*u* is cured. By the curing, the upper layer 40*u* is formed from the upper material layer 240*u*. The hole injection layer 40 is post-baked as necessary (step S48).

The disclosure is not limited to each of the embodiments described above, and various modifications may be made within the scope of the claims. Embodiments obtained by appropriately combining technical approaches disclosed in different embodiments also fall within the technical scope of the disclosure. Furthermore, novel technical features can be formed by combining the technical approaches disclosed in the embodiments.

The invention claimed is:

1. A display device comprising:

an anode;

a hole injection layer;

a first light-emitting layer that emits light of a first color; and a cathode, wherein;

the hole injection layer contains;

a mixture of PEDOT/PSS (PEDOT/PSS) in which polystyrene sulfonic acid (PSS) is mixed with polyethylenedioxythiophene (PEDOT), and a first polymer adjacent to the PEDOT/PSS mixture, the first polymer is a crosslinked polymer obtained by crosslinking a second polymer, and the second polymer is a water-soluble polymer.

2. The display device according to claim 1, wherein the first polymer exhibits alkali resistance.

3. The display device according to claim 2, wherein the first polymer is insoluble in an alkaline solution of pH11 or higher.

4. The display device according to claim 2, wherein the first polymer contains at least one polymer selected from the group consisting of polyvinyl alcohol (PVA), polyvinyl pyrrolidone (PVP), gelatin, nylon, acrylic, urethane, polyester, polyether, melamine, epoxy, polyethyleneimine, and polyethylene oxide.

5. The display device according to claim 1, further comprising:

a second light-emitting layer that emits light of a second color different from the first color.

6. The display device according to claim 1, wherein the hole injection layer is a single layer.

7. The display device according to claim 1, wherein the anode includes a first pixel electrode and a second pixel electrode, and the hole injection layer includes a first portion overlapping the first pixel electrode and a second portion overlapping the second pixel electrode, the first portion being separated from the second portion.

8. The display device according to claim 1, wherein the hole injection layer includes:

a lower layer containing the PEDOT/PSS mixture, and an upper layer containing the first polymer and covering the lower layer.

9. A display device comprising:

an anode;

a hole injection layer;

a first light-emitting layer that emits light of a first color; and a cathode, wherein:

the hole injection layer contains:

a mixture of PEDOT/PSS in which polystyrene sulfonic acid (PSS) is mixed with polyethylenedioxythiophene (PEDOT), and a first polymer adjacent to the PEDOT/PSS mixture, and the first polymer exhibits alkali resistance.

10. The display device according to claim 9,
wherein the first polymer is insoluble in an alkaline solution of pH11 or higher.

11. The display device according to claim 9,
wherein the first polymer contains at least one polymer selected from the group consisting of polyvinyl alcohol (PVA), polyvinyl pyrrolidone (PVP), gelatin, nylon, acrylic, urethane, polyester, polyether, melamine, epoxy, polyethyleneimine, and polyethylene oxide.

12. The display device according to claim 9, further comprising:
a second light-emitting layer that emits light of a second color different from the first color.

13. The display device according to claim 9,
wherein the hole injection layer is a single layer.

14. The display device according to claim 9,
wherein the anode includes a first pixel electrode and a second pixel electrode, and
the hole injection layer includes a first portion overlapping the first pixel electrode and a second portion overlapping the second pixel electrode, the first portion being separated from the second portion.

15. The display device according to claim 9,
wherein the hole injection layer includes:
a lower layer containing the PEDOT/PSS mixture, and
an upper layer containing the first polymer and covering the lower layer.

* * * * *